United States Patent
Tsao et al.

(10) Patent No.: US 10,163,827 B1
(45) Date of Patent: Dec. 25, 2018

(54) PACKAGE STRUCTURE WITH PROTRUSION STRUCTURE

(71) Applicant: Taiwan Semiconductor Manufacturing Co., Ltd., Hsinchu (TW)

(72) Inventors: Pei-Haw Tsao, Taichung (TW); Chen-Shien Chen, Zhubei (TW); Li-Huan Chu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/812,690

(22) Filed: Nov. 14, 2017

(51) Int. Cl.
*H01L 23/00* (2006.01)
*H01L 25/00* (2006.01)
(Continued)

(52) U.S. Cl.
CPC ........ *H01L 24/04* (2013.01); *H01L 23/49811* (2013.01); *H01L 24/13* (2013.01); *H01L 24/14* (2013.01); *H01L 25/105* (2013.01); *H01L 25/50* (2013.01); *H01L 24/16* (2013.01); *H01L 2224/02331* (2013.01); *H01L 2224/02371* (2013.01); *H01L 2224/02377* (2013.01); *H01L 2224/02379* (2013.01); *H01L 2224/02381* (2013.01); *H01L 2224/0401* (2013.01); *H01L 2224/10125* (2013.01);
(Continued)

(58) Field of Classification Search
CPC ....... H01L 24/04; H01L 25/105; H01L 24/14; H01L 24/13; H01L 23/49811; H01L 25/50; H01L 2224/13014; H01L 2924/3512; H01L 2224/02371; H01L 2224/02381; H01L 24/16; H01L 2224/02377; H01L 2224/02331; H01L 2224/10125; H01L 2225/1058; H01L 2225/1035; H01L 2224/0401; H01L 2224/14131; H01L 2224/16145; H01L 2224/02379
See application file for complete search history.

(56) References Cited

U.S. PATENT DOCUMENTS 9,000,584 B2   4/2015   Lin et al.
9,048,222 B2   6/2015   Hung et al.
(Continued)

*Primary Examiner* — Kyoung Lee
(74) *Attorney, Agent, or Firm* — Birch, Stewart, Kolasch & Birch, LLP

(57) ABSTRACT

A package structure is provided. The package structure includes a dielectric layer formed over a first substrate and a conductive layer formed in the dielectric layer. The package structure includes an under bump metallurgy (UBM) layer formed over the dielectric layer, and the UBM layer is electrically connected to the conductive layer. The package structure also includes a first protrusion structure formed over the UBM layer, and the first protrusion structure extends upward away from the UBM layer. The package structure further includes a second protrusion structure formed over the UBM layer, and the second protrusion structure extends upward away from the UBM layer. The package structure includes a first conductive connector formed over the first protrusion structure; and a second conductive connector formed over the second protrusion structure. An air gap is formed between the first protrusion structure and the second protrusion structure.

20 Claims, 21 Drawing Sheets

(51) Int. Cl.
*H01L 23/498* (2006.01)
*H01L 25/10* (2006.01)

(52) U.S. Cl.
CPC ............... *H01L 2224/13014* (2013.01); *H01L 2224/14131* (2013.01); *H01L 2224/16145* (2013.01); *H01L 2225/1035* (2013.01); *H01L 2225/1058* (2013.01); *H01L 2924/3512* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2004/0197979 A1* | 10/2004 | Jeong .................. B23K 3/0607 438/202 |

* cited by examiner

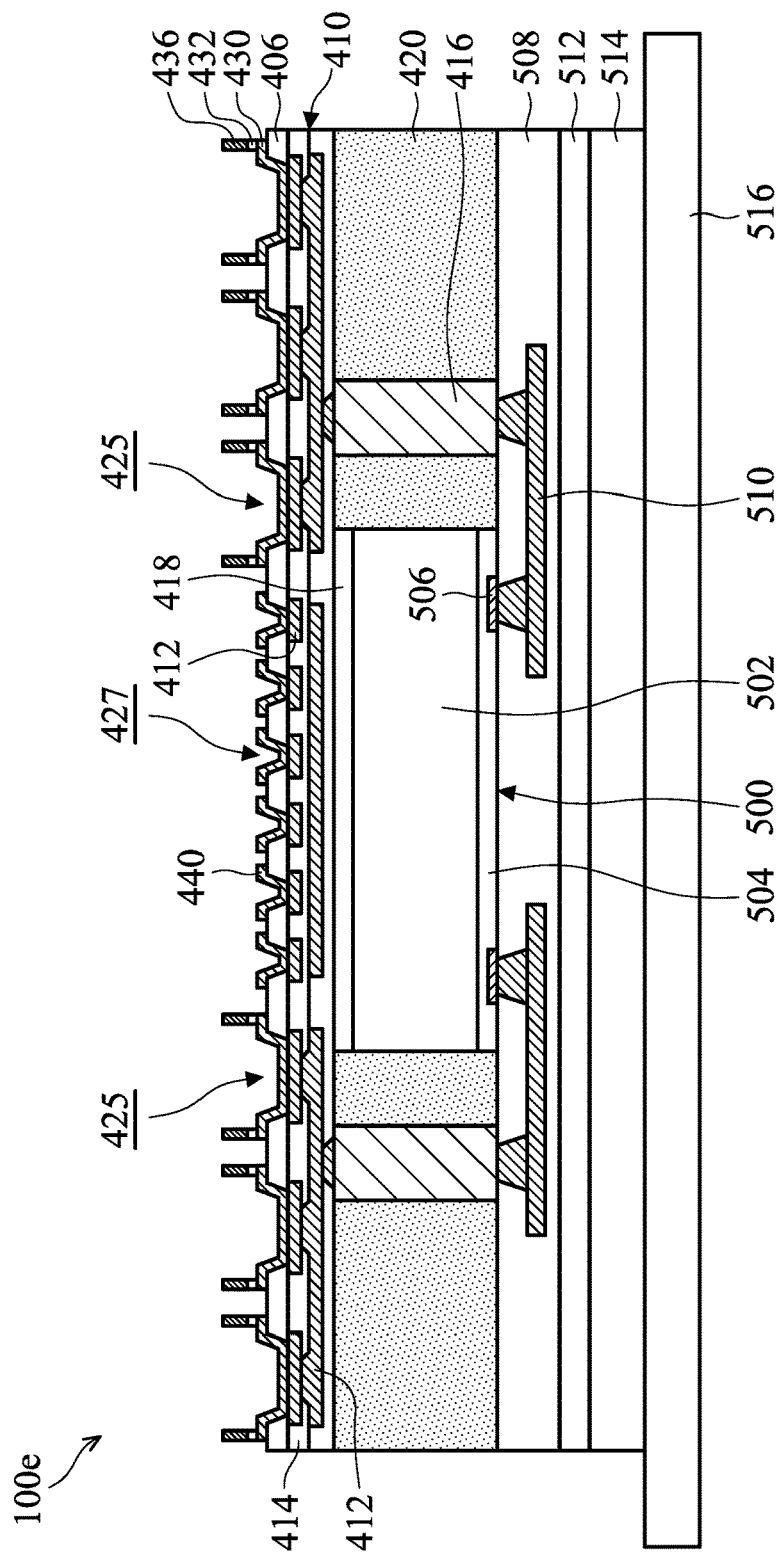

PACKAGE STRUCTURE WITH PROTRUSION STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting the new packaging technologies, various packages with different or similar functions are integrated together.

Although existing package structures and methods of fabricating package structures have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 6A-6H show cross-sectional representations of various stages of forming a first package structure, in accordance with some embodiments of the disclosure.

DETAILED DESCRIPTION

Figure 1A:
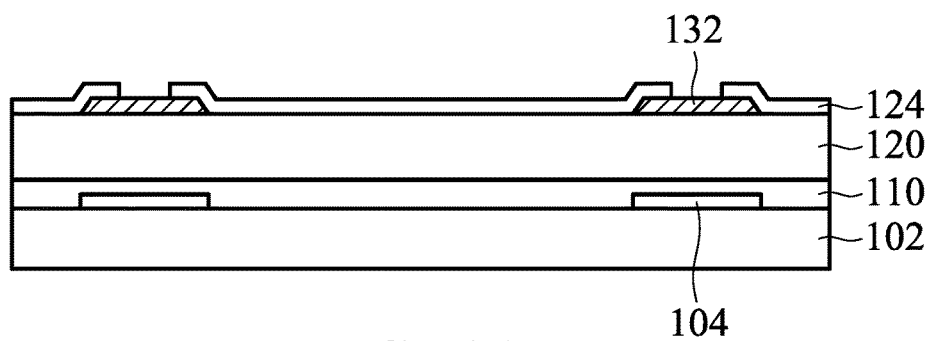
FIGS. 1A-1L show cross-sectional representations of various stages of forming a first package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a package structure and method for forming the same are provided. FIGS. 1A-1L show cross-sectional representations of various stages of forming a first package structure 100a, in accordance with some embodiments of the disclosure.

As shown in FIG. 1A, a substrate 102 is provided. The substrate 102 may be made of silicon (Si) or other semiconductor materials, such as germanium (Ge). In some embodiments, the substrate 102 is a substrate of a device die. In some embodiments, the substrate 102 is made of a compound semiconductor such as silicon carbide, gallium arsenic, indium arsenide, or indium phosphide. In some embodiments, the substrate 102 is made of semiconductor material, ceramic material, polymer material, metal material, another applicable material or a combination thereof. In some embodiments, the substrate 102 is a glass substrate. In some embodiments, the substrate 102 is a semiconductor substrate, such as silicon wafer.

The device elements 104 are formed on substrate 102. The device elements 104 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements 104, such as deposition, etching, implantation, photolithography, annealing, and/or other applicable processes. In some embodiments, device elements 104 are formed in the substrate 102 in a front-end-of-line (FEOL) process.

The substrate 102 may include various doped regions such as p-type wells or n-type wells). Doped regions may be doped with p-type dopants, such as boron or $BF_2$, and/or n-type dopants, such as phosphorus (P) or arsenic (As). The doped regions may be formed in or on the substrate 102, in a P-well structure, in an N-well structure, or in a dual-well structure.

The substrate 102 may further include isolation features (not shown), such as shallow trench isolation (STI) features or local oxidation of silicon (LOCOS) features. Isolation features may define and isolate various device elements.

An inter-metal dielectric (IMD) layer 120 is formed over the ILD layer 110. The IMD layer 120 is made of silicon oxide (SiOx), silicon nitride (SixNy), silicon oxynitride (SiON), dielectric material(s) with low dielectric constant (low-k), or combinations thereof. In some embodiments, the IMD layer 120 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the IMD layer 120 is deposited by a plasma enhanced chemical vapor deposition (PECVD) process or by a spin coating process.

A conductive pad 132 is formed over the IMD layer 120. The conductive pad 132 is electrically connected to the device elements 104 through various metallic lines and vias in the IMD layer 120.

The IMD layer 120 and the conductive pad 132 are formed in a back-end-of-line (BEOL) process. The conductive pad 132 can be made of copper (Cu), copper alloy, aluminum (Al), aluminum alloy, tungsten (W), tungsten alloy, titanium (Ti), titanium alloy, tantalum (Ta) or tantalum alloy. In some embodiments, the conductive pad 132 is formed by a plating method.

A passivation layer 124 is formed over the IMD layer 120 and covers the edge portions of the conductive pad 132. In addition, the center portions of the conductive pad 132 are exposed. In some embodiments, the passivation layer 124 is made of non-organic materials, such as silicon oxide, undoped silicate glass, silicon oxynitride, solder resist (SR), silicon nitride, HMDS (hexamethyldisilazane). In some other embodiments, the passivation layer 124 is made of a polymer material, such as polyimide (PI), epoxy, or fluorine (F)-containing polymer.

Figure 1B:
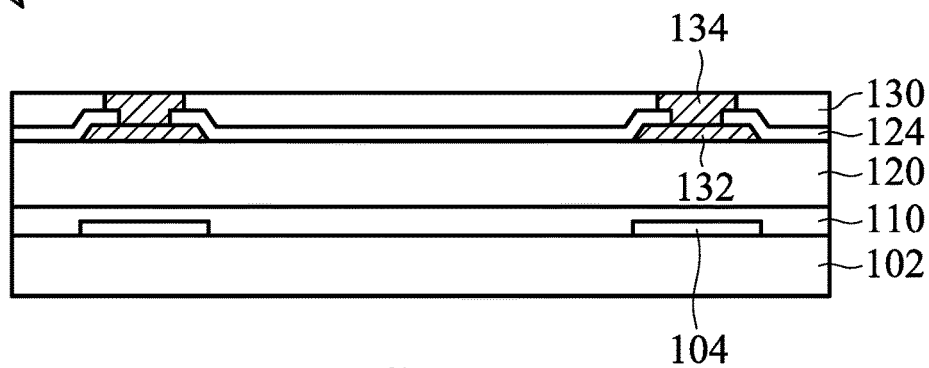

Next, as shown in FIG. 1B, after the passivation layer 124 is formed, a first dielectric layer 130 is formed over the passivation layer 124, in accordance with some embodiments of the disclosure.

Afterwards, the first dielectric layer 130 is patterned by a patterning process to expose a portion of the conductive pad 132. The patterning process includes a photolithography process and an etching process. Examples of a photolithography process include soft baking, mask aligning, exposure, post-exposure baking, developing the photoresist, rinsing and drying (e.g., hard baking). The etching process may be a dry etching or a wet etching process.

In some embodiments, the first dielectric layer 130 is made of silicon oxide (SiOx), silicon nitride (SixNy), silicon oxynitride (SiON), or another applicable material. A post-passivation interconnect (PPI) pad 134 is formed in the first dielectric layer 130, and it is electrically connected to the conductive pad 132. The PPI pad 134 is formed after the formation of the passivation layer 124. In some embodiments, the PPI pad 134 is called a redistribution layer (RDL) pad.

The PPI pad 134 is made of conductive material, such as copper (Cu), copper alloy, aluminum (Al), aluminum alloy, tungsten (W), tungsten alloy, titanium (Ti), titanium alloy, tantalum (Ta) or tantalum alloy. The PPI pad 134 is formed by plating, electroless plating, sputtering or chemical vapor deposition (CVD).

The PPI pad 134 may be formed by filling a conductive material such as a metal material into openings and on the first dielectric layer 130. Afterwards, the excess conductive material is removed by a chemical mechanical polishing (CMP) process.

Figure 1C:
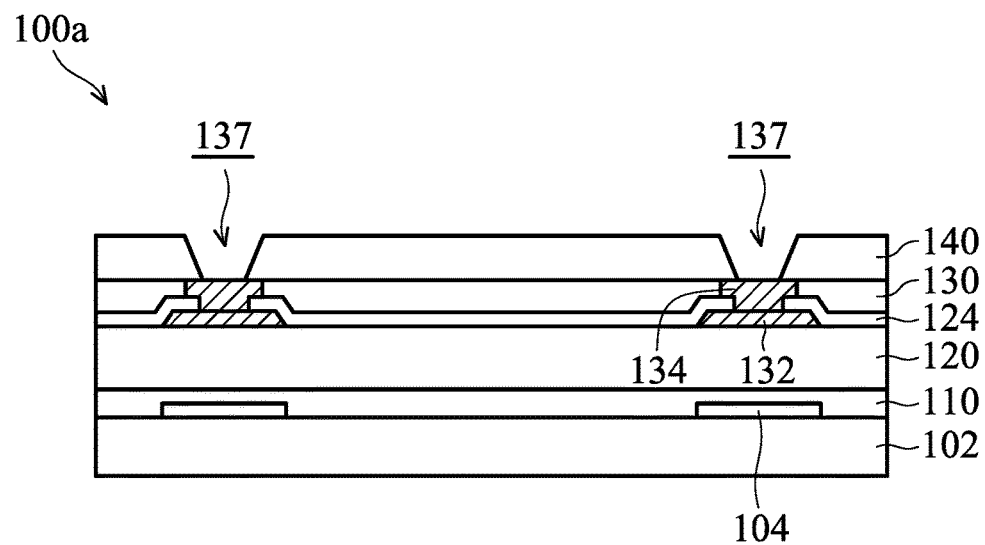

Next, as shown in FIG. 1C, after the PPI pad 134 is formed, a second dielectric layer 140 is formed over the first dielectric layer 130 and the PPI pad 134, in accordance with some embodiments of the disclosure. The second dielectric layer 140 is made of polybenzoxazole (PBO), benzocyclobuten (BCB), silicone, acrylates, siloxane, or combinations thereof.

After the second dielectric layer 140 is formed, the second dielectric layer 140 is patterned to form openings 137 by the patterning process. Therefore, at least a portion of the PPI pad 134 is exposed.

Figure 1D:
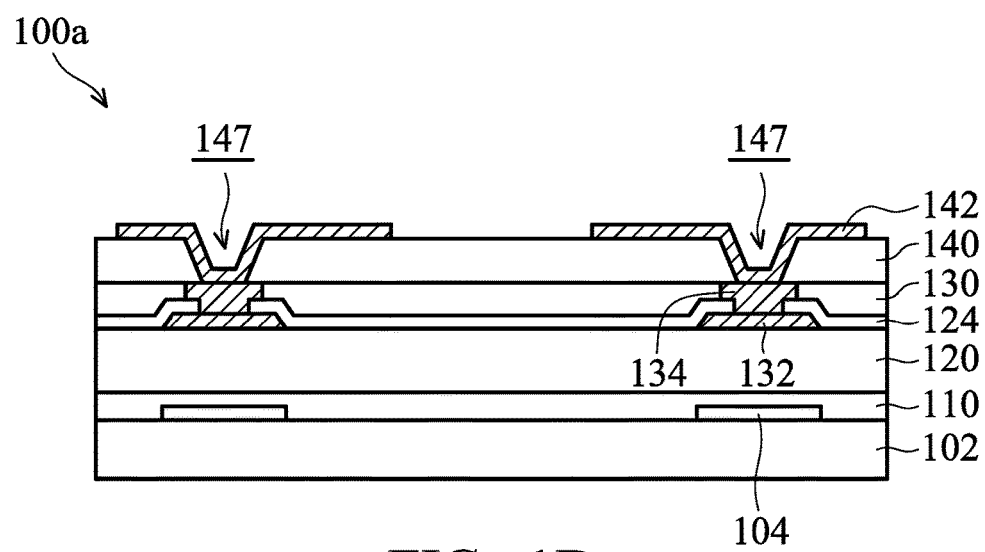

Afterwards, as shown in FIG. 1D, the conductive layer 142 is formed in the openings 137 and on the second dielectric layer 140, in accordance with some embodiments of the disclosure. The conductive layer 142 is electrically connected to the PPI pad 134. The conductive layer 142 is used to electrical connected to a different region of the substrate 102.

The conductive layer 142 is made of a conductive material, such as copper (Cu), copper alloy, aluminum (Al), aluminum alloy, tungsten (W), tungsten alloy, titanium (Ti), titanium alloy, tantalum (Ta) or tantalum alloy. The conductive layer 142 is formed by plating, electroless plating, sputtering or chemical vapor deposition (CVD).

Figure 1E:
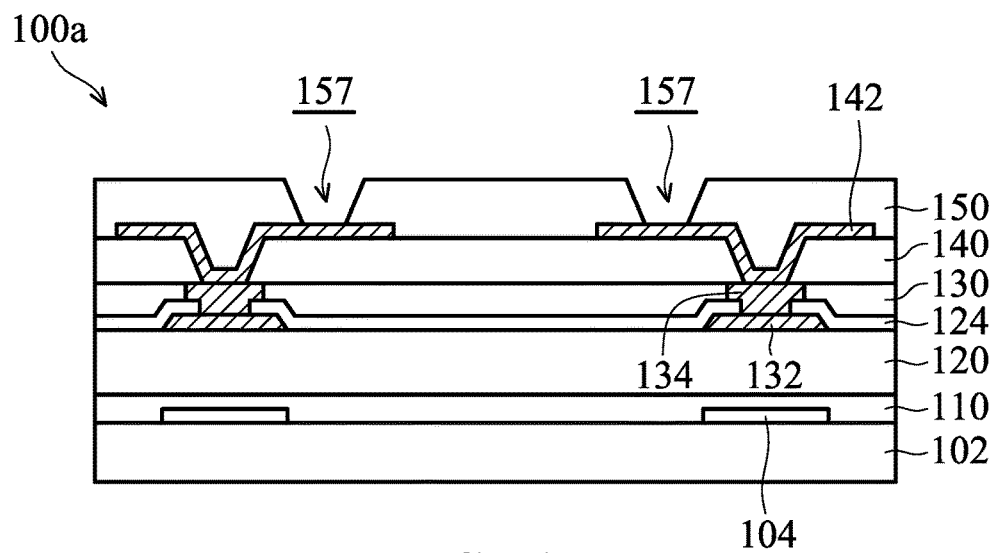

Afterwards, as shown in FIG. 1E, after the conductive layer 142 is formed, a protection layer 150 is formed in accordance with some embodiments of the disclosure. Afterwards, the protection layer 150 is patterned to form openings 157. A portion of the conductive layer 142 is exposed by the openings 157.

The protection layer 150 is formed over the device element 104 for preventing moisture penetration that may result in underlying protection layers and PPI structure delaminated. The formation of the protection layer 150 helps the package structure 100a able to pass through extreme environments, such as various reliability tests, without moisture being able to penetrate.

In some embodiments, the protection layer 150 includes inorganic materials such as silicon nitride, silicon oxide, silicon oxynitride, HMDS (hexamethyldisilazane) or a combination thereof. Alternatively, the protection layer 150 includes a polymer, such as polyimide (PI), epoxy, solder resist (SR), fluorine (F)-containing polymer or combinations thereof.

Figure 1F:
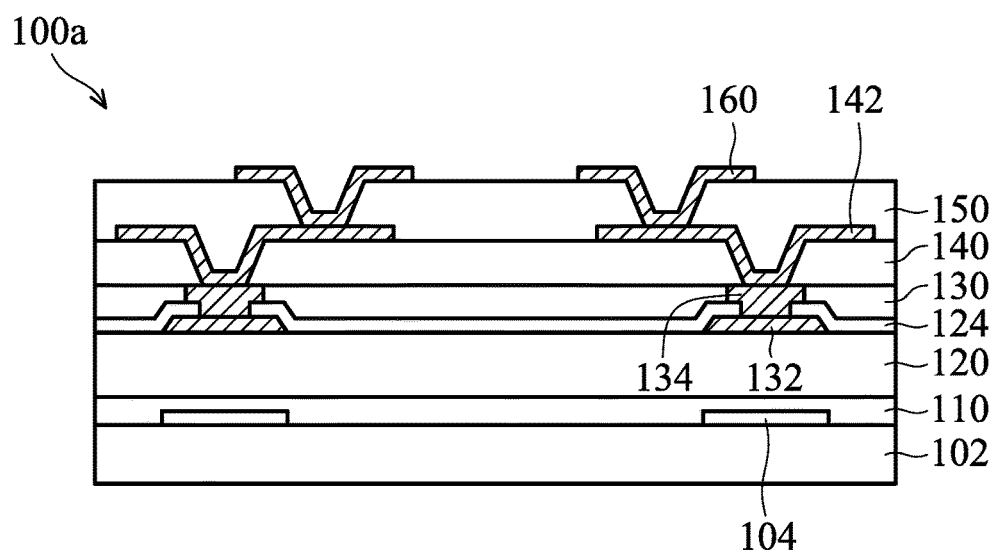

Next, as shown in FIG. 1F, after the openings 157 are formed, a under bump metallurgy (UBM) layer 160 is formed in the protection layer 150, in accordance with some embodiments of the disclosure.

The UBM layer 160 may be made of conductive material, such as copper (Cu), copper alloy, aluminum (Al), aluminum alloy, tungsten (W), tungsten alloy, titanium (Ti), titanium alloy, tantalum (Ta) or tantalum alloy. In addition, the UBM layer 160 may contain an adhesion layer and/or a wetting layer. In some embodiments, the UBM layer 160 further includes a copper seed layer. In some embodiments, the UBM layer 160 includes an adhesion layer made of Ti/Cu and a wetting layer made of Cu.

Figure 1G:
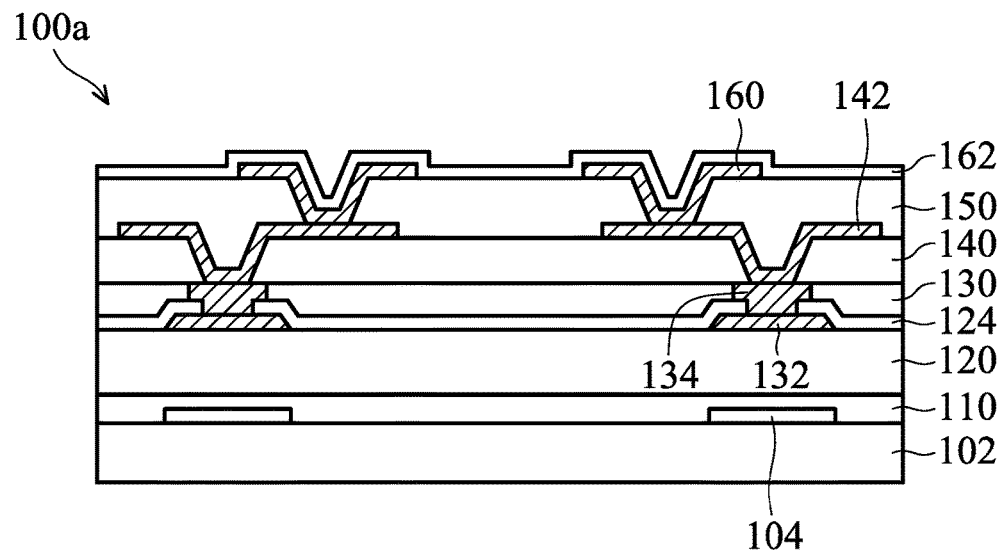

Afterwards, as shown in FIG. 1G, a seed layer 162 is conformally formed over the protection layer 150 and the UBM layer 160, in accordance with some embodiments of the disclosure. The seed layer 162 is made of metal material, such as copper (Cu), titanium (Ti), copper alloy, titanium alloy or combinations thereof. In some embodiments, the seed layer 162 is formed by a deposition process, such as chemical vapor deposition process (CVD), physical vapor deposition process (PVD), another applicable process or combinations thereof.

Figure 1H:
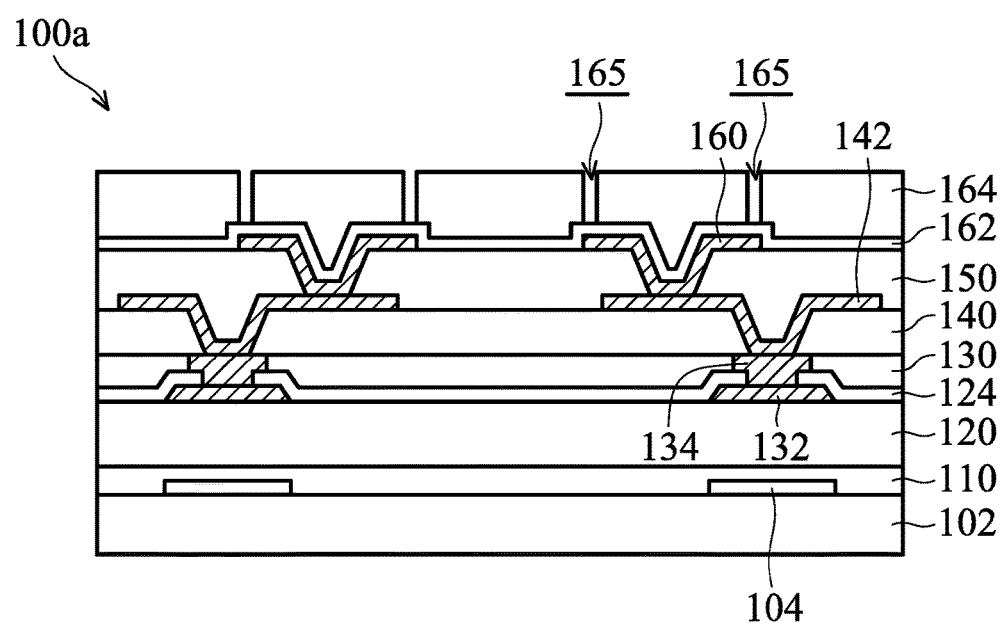

Next, as shown in FIG. 1H, a photoresist layer 164 is formed over the seed layer 162, and the photoresist layer 164 is patterned to form a number of openings 165, in accordance with some embodiments of the disclosure. As a result, a portion of the seed layer 162 is exposed.

Figure 1I:
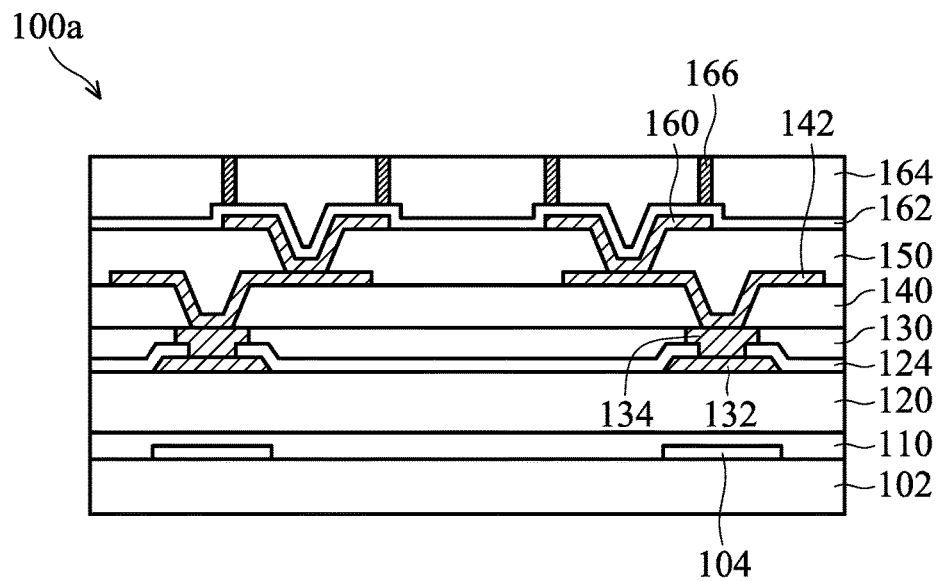

Afterwards, as shown in FIG. 1I, a conductive material is formed in the openings 165 and on the seed layer 162 to form a number of protrusion structures 166, in accordance with some embodiments of the disclosure. The protrusion structures 166 extend upward away from the UBM layer 160. More specifically, the protrusion structures 166 extend upward from a top surface of the seed layer 162 to a position which is higher than the UBM layer 160.

Figure 1J:
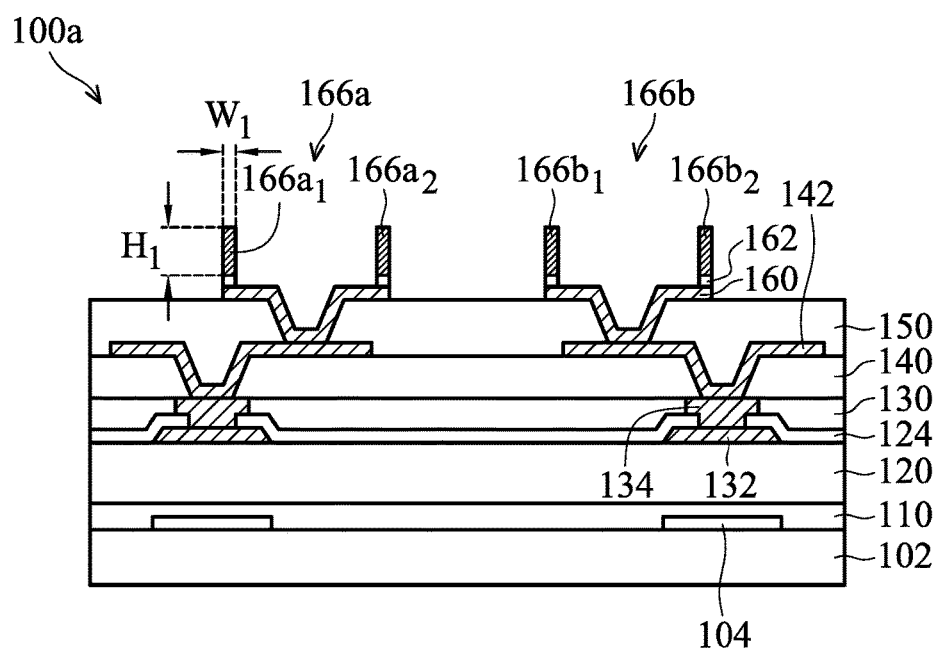
Figure 1K:
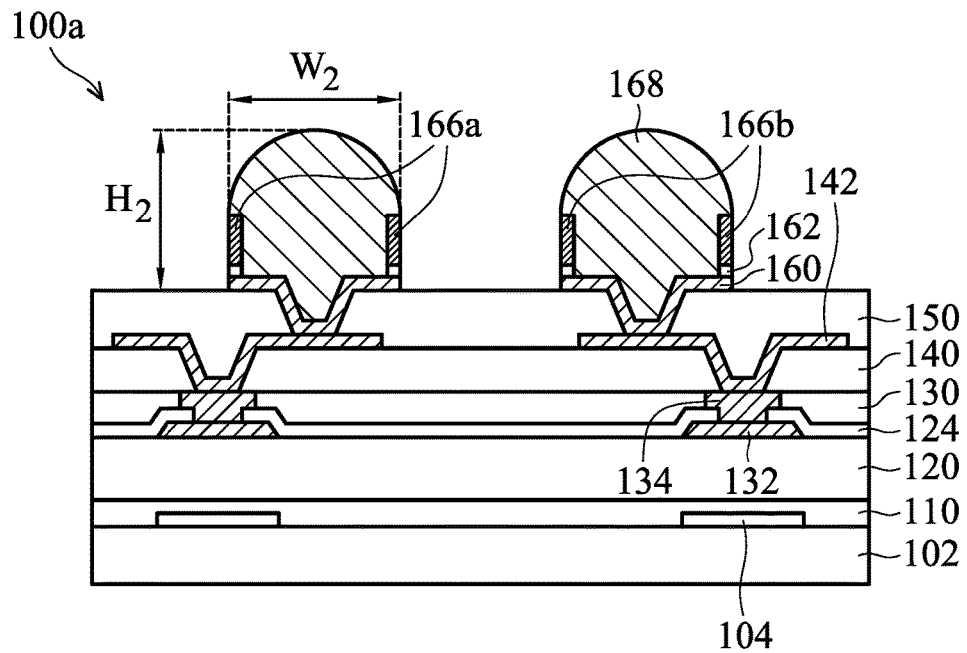

The protrusion structures 166 are used as crack-stop structures to suppress the propagation of cracks in the electrical connector 168 (shown in FIG. 1K). In addition, the protrusion structures 166 are used to prevent the formation of cracks.

As shown in FIG. 1J, the photoresist layer 164 is removed, and a portion of the seed layer 162 is removed, in accordance with some embodiments of the disclosure. As a result, the protrusion structures 166 include a first protrusion structure 166a and a second protrusion structure 166b.

The first protrusion structure 166a includes a first portion $166a_1$ and a second portion $166a_2$, and the second protrusion structure 166b includes a first portion $166b_1$ and a second portion $166b_2$. An outer sidewall surface of each of the first protrusion structure 166a and the second protrusion structure 166b is aligned with an outer sidewall surface of the UBM layer 160.

In some embodiments, each of the protrusion structures 166a, 166b is made of copper (Cu), copper alloy, aluminum (Al), aluminum alloy, tungsten (W), tungsten alloy, titanium (Ti), titanium alloy, tantalum (Ta) or tantalum alloy. In some embodiments, the protrusion structure 166 is formed using a plating method.

The protrusion structure 166 has a first height $H_1$ along a vertical direction and a first width $W_1$ along a horizontal direction. In some embodiments, the first height $H_1$ is in a range from about 10 μm to about 50 μm. In some embodiments, the first width $W_1$ is in a range from about 20 μm to about 40 μm.

Next, as shown in FIG. 1K, a number of electrical connectors 168 are formed over the protrusion structures 166, in accordance with some embodiments of the disclosure. The electrical connectors 168 are directly formed on the UBM layer 160 and the protrusion structures 166. The first protrusion structure 166a and the second protrusion structure 166b are independently embedded in the electrical connector 168. The outer sidewall surface of each of the first protrusion structure 166a and the second protrusion structure 166b is substantially aligned with an outer sidewall surface of the electrical connector 168.

The melting point of each of the first protrusion structure 166a and the second protrusion structure 166b is higher than the melting point of each of the electrical connector 168. Each of the electrical connectors 168 is made of conductive materials with low resistivity, such as solder or solder alloy. Exemplary elements included in the solder alloy may include Sn, Pb, Ag, Cu, Ni, Bi or a combination thereof.

Each of the electrical connectors 168 has a second height $H_2$ which is measured from a top surface of the protection layer 150 to a top surface of the electrical connector 168. In some embodiments, the second height $H_2$ is in a range from about 150 μm to about 200 μm. In some embodiments, a height ratio ($H_1/H_2$) of the first height $H_1$ to the second height $H_2$ is in a range from about 1/20 to about 1/3. If the height ratio is too small, the protrusion structures 166a, 166b are not high enough to stop the crack. If the height ratio is too large, it may be difficult to form the electrical connector 168 on the UBM layer 160. The electrical connector 168 has a second width $W_2$ in a horizontal direction. In some embodiments, the second width $W_2$ is in a range from about 180 μm to about 200 μm.

Figure 1L:
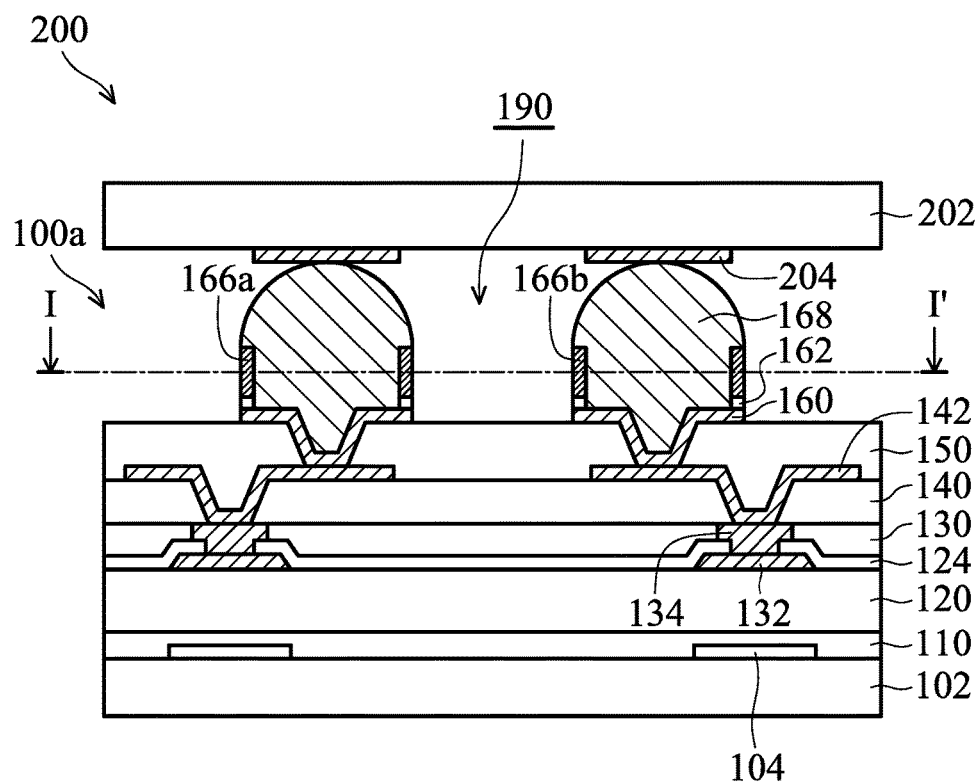

As shown in FIG. 1L, a second package structure 200 is formed over the first package structure 100a, in accordance with some embodiments of the disclosure. The second package structure 200 includes a conductive pad 204 formed on a second substrate 202. Some device elements (not shown) are formed in the second substrate 202. The first package structure 100a and the second package structure 200 are bonded together by the conductive structure 168 and the conductive pad 204.

An air gap 190 is formed between the first protrusion structure 166a and the second protrusion structure 166b. It should be noted that no underfill is between the first protrusion structure 166a and the second protrusion structure 166b. Since the first protrusion structure 166a and the second protrusion structure 166b can suppress the crack or prevent crack formation, and no underfill which have function to reduce the crack is not used. Therefore, the fabrication time and cost are reduced.

It should be noted that when the size of the die (e.g. the substrate 102) become greater, the stress concentrated on the electrical connectors will become greater. As a result, some cracks will be formed in the electrical connector. The protrusion structures 166 are used as stress stop structures to suppress the propagation of cracks in the electrical connector 168. Since the cracks are suppressed in the electrical connector 168, the performance and reliability of the package structure 100a are improved.

Figure 2A:
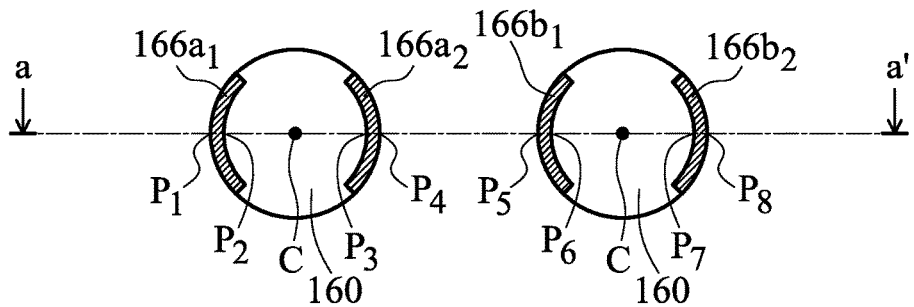
FIG. 2A shows a top view of the first protrusion structure, the second protrusion structure and the UBM layer taken long II' line of FIG. 1L, in accordance with some embodiments of the disclosure.

FIG. 2A shows a top view of the first protrusion structure 166a, the second protrusion structure 166b and the UBM layer 160 taken long II' line of FIG. 1L, in accordance with some embodiments of the disclosure.

The first protrusion structure 166a has a non-continuous shape when seen from a top view and has the first portion $166a_1$ and the second portion $166a_2$. Each of the first portion $166a_1$ and the second portion $166a_2$ has a bow-shaped structure. The electrical connector 168 has a circle shape when seen from a top view. It should be noted that if the first protrusion structure 166a include a continuous ring, some voids may be formed in the electrical connector 168. Therefore, the first protrusion structure 166a does not include a continuous ring portion.

There is a center point C in the UBM layer 160. The first portion $166a_1$ and the second portion $166a_2$ are symmetric to the center C of the UBM layer 160. There is a first dummy middle line $P_1P_2$ cross the first portion $166a_1$ of the first protrusion structure 166a. There is a second dummy middle line P3P4 cross the second portion $166a_2$ of the first protrusion structure 166a. The first dummy middle line $P_1P_2$ and the second dummy middle line P3P4 both are symmetric axial. The first dummy middle line P1P2 and the second dummy middle line P3P4 both cross the center C of the UBM layer 160.

It should be noted that the first dummy middle line P1P2 and the second dummy middle line P3P4 are used to define the shape of the first protrusion structure 166a and the second protrusion structure 166b and both are not real lines.

Similarly, the second protrusion structure 166b includes the first portion 166b and the second portion 166b. The first portion $166b_1$ and the second portion $166b_2$ of the second protrusion structure 166b are symmetric to the center C of the UBM layer 160. The third dummy middle line P5P6 of the first portion $166b_1$ and the fourth dummy middle line P7P8 of the second portion 166b2 both cross the center C of the UBM layer 160.

As shown in FIG. 2A, a ratio of the length sum of the length of the first portion $166a_1$ and the length of the second portion $166a_2$ of the first protrusion structure 166a relative to the circumference of the electrical connector 168 is in a range from about 1/3 to about 1/2. If the ratio is not within the aforementioned range, the first protrusion structure 166a may not suppress the propagation of cracks in the electrical connector 168.

Figure 2B:
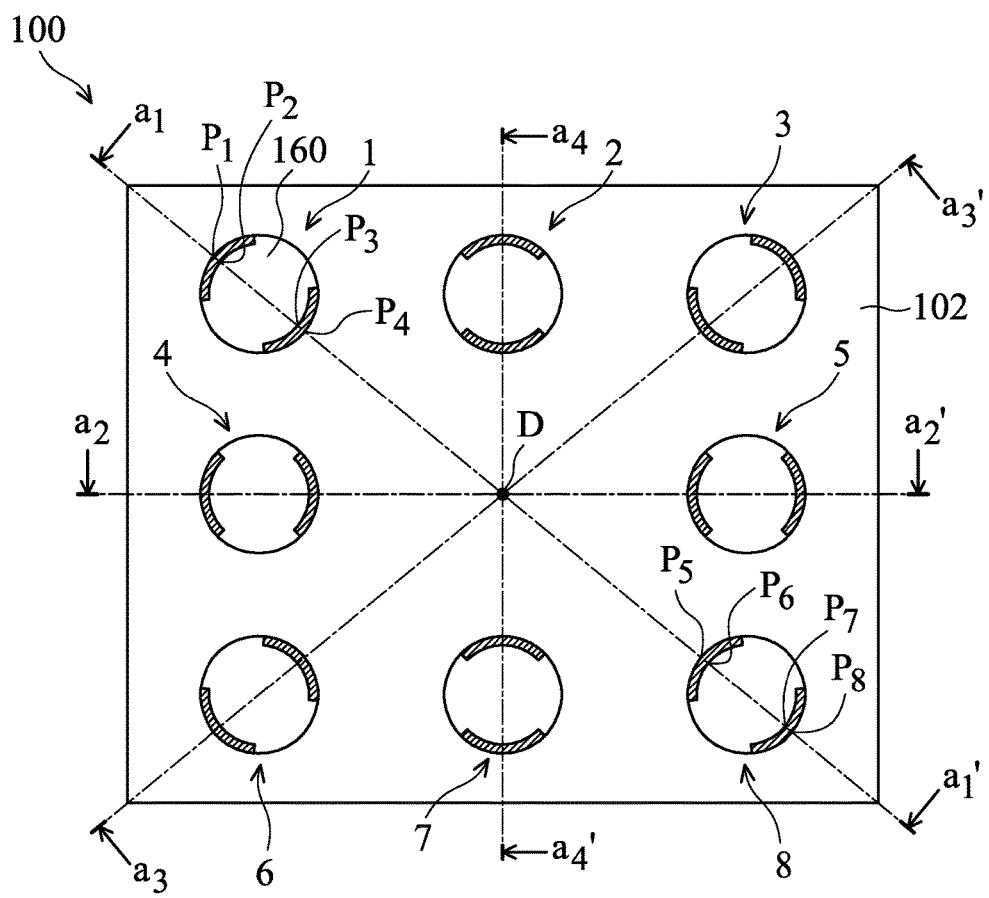
FIG. 2B shows a top view of the arrangement of the first protrusion structure, the second protrusion structure, the UBM layer and the first substrate of FIG. 1L, in accordance with some embodiments of the disclosure.

FIG. 2B shows a top view of the arrangement of the first protrusion structure 166a, the second protrusion structure 166b, the UBM layer 160 and the first substrate 102 of FIG. 1L, in accordance with some embodiments of the disclosure. The aa' line shown in FIG. 2A may be the $a_1a_1'$ line, $a_2a_2'$ line, $a_3a_3'$ line or $a_4 a_4'$ line shown in FIG. 2B.

The substrate 102 has a rectangular shape when seen from a top view. In some embodiments, the substrate 102 is a substrate of a die. The substrate 102 has a center point D. There are multiple electrical connectors 168 formed over the substrate 102. Although eight electrical connectors 168 are shown in FIG. 2B, the number of electrical connectors 168 may be greater than eight according to actual application. In some embodiments, the substrate 102 is a die which has an area in a range from about 5*5 mm$^2$ to about 7*7 mm$^2$.

The $a_1a_1'$ line, $a_2a_2'$ line, $a_3a_3'$ line and $a_4 a_4'$ line cross the center D of the substrate 102 (or the die). The $a_1a_1'$ line, $a_2a_2'$ line, $a_3a_3'$ line and $a_4 a_4'$ line cross to the center D of the substrate 102. In other words, the $a_1a_1'$ line, $a_2a_2'$ line, $a_3a_3'$ line and $a_4 a_4'$ line are radiating out from the center D of the substrate 102. The stress may be concentrated on the electrical connectors 168, especially those in a diagonal position. Therefore, the first protrusion structure 166a and the second protrusion structure 166b are positioned on the horizontal lines, vertical lines, or diagonal lines meeting at the center D of the substrate 102.

The two electrical connectors 168 shown in FIG. 2A may be number one and number eight along aa' line shown in FIG. 2B. Furthermore, the first dummy middle line P1P2 in the first portion $166a_1$ of the first protrusion structure 166a, and the second dummy middle line P3P4 in the second portion $166a_2$ of the first protrusion structure 166a cross the center D in the substrate 102.

In some embodiments, the two electrical connectors 168 shown in FIG. 2A are number two and number seven along $a_4a_4'$ line shown in FIG. 2B. In some other embodiments, the two electrical connectors 168 shown in FIG. 2A are number four and number five along $a_2a_2'$ line shown in FIG. 2B. In some other embodiments, the two electrical connectors 168 shown in FIG. 2A are numbers six and three along a3a3' line shown in FIG. 2B.

Figure 3A:
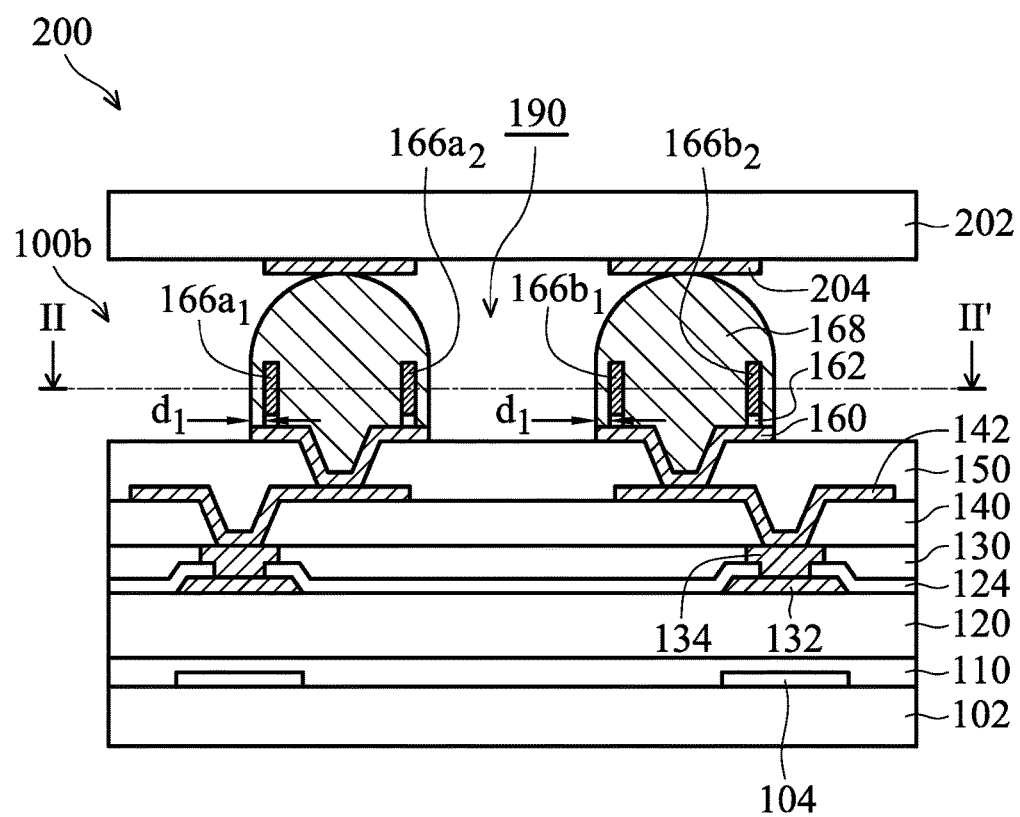
FIG. 3A shows a cross-sectional representation of a package structure, in accordance with some embodiments of the disclosure.

FIG. 3A shows a cross-sectional representation of a package structure 100b, in accordance with some embodiments of the disclosure. FIG. 3A is similar to FIG. 1L, and the outer sidewall surface of each of the first protrusion structure 166a and the second protrusion structure 166b are not aligned with the sidewall surface of the UBM layer 160 in FIG. 3A. There is a first distance $d_1$ between the outer sidewall surface of the UBM layer 160 and the outer sidewall surface of the first protrusion structure 166a. In some embodiments, the first distance $d_1$ is in a range from about 0.1 μm to about 50 μm.

Figure 3B:
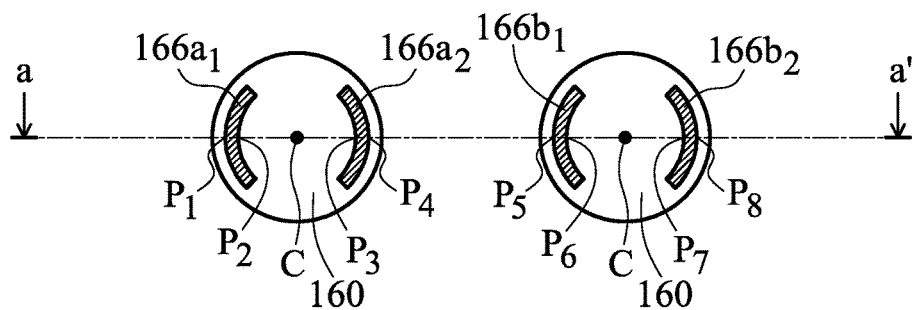
FIG. 3B shows a top view of the first protrusion structure, the second protrusion structure and the UBM layer taken long II-II' line of FIG. 3A, in accordance with some embodiments of the disclosure.

FIG. 3B shows a top view of the first protrusion structure 166a, the second protrusion structure 166b and the UBM layer 160 taken long II-II' line of FIG. 3A, in accordance with some embodiments of the disclosure. The first protrusion structure 166a includes the first portion $166a_1$ and the second portion $166a_2$. The first portion $166a_1$ and the second portion $166a_2$ of the first protrusion structure 166a are symmetric to the center C of the UBM layer 160. The first dummy middle line P1P2 of the first portion $166a_1$ and the second dummy middle line P3P4 of the second portion $166a_2$ both cross the center C of the UBM layer 160.

Figure 3C:
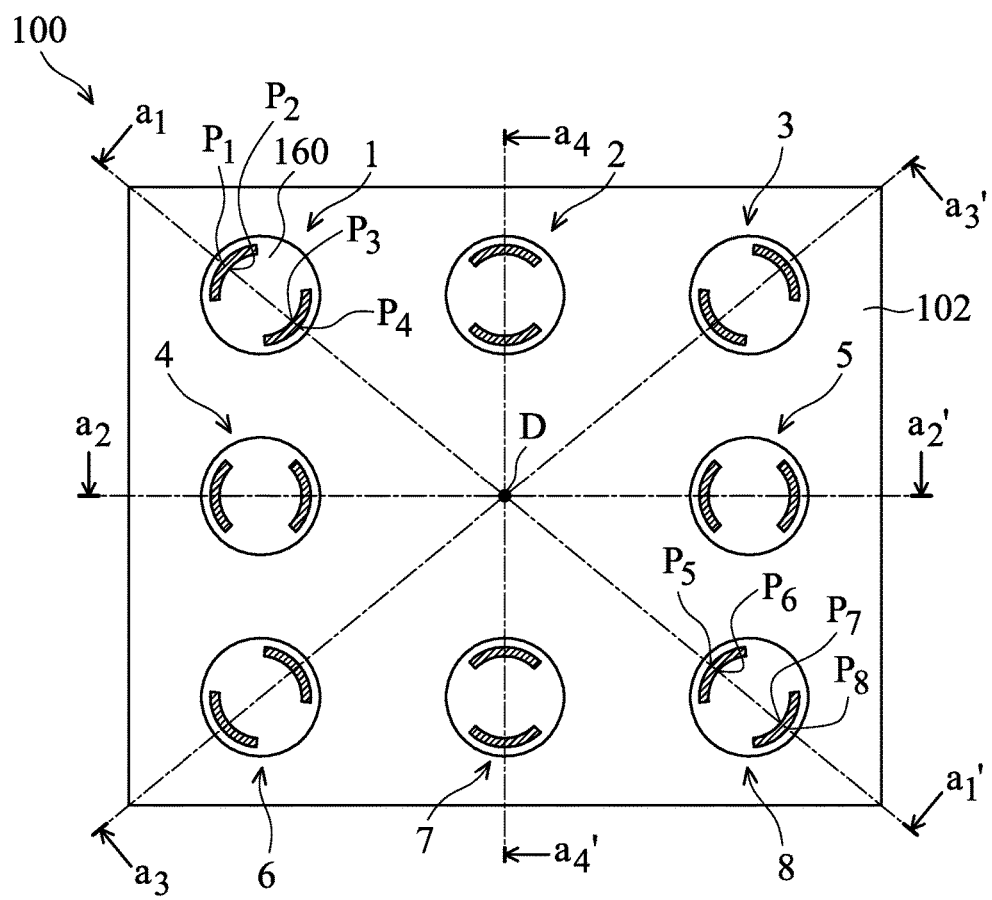
FIG. 3C shows a top view of the arrangement of the first protrusion structure, the second protrusion structure, the UBM layer and the first substrate of FIG. 3A, in accordance with some embodiments of the disclosure.

FIG. 3C shows a top view of the arrangement of the first protrusion structure 166a, the second protrusion structure 166b, the UBM layer 160 and the first substrate 102 of FIG. 3A, in accordance with some embodiments of the disclosure. The aa' line shown in FIG. 3B may be the $a_1a_1'$ line, $a_2a_2'$ line, $a_3a_3'$ line or $a_4 a_4'$ line shown in FIG. 3C. The substrate 102 has a rectangular shape when seen from a top view. In some embodiments, the substrate 102 is a substrate of a die. There are a number of electrical connectors 168 are formed over the substrate 102. The $a_1a_1'$ line, $a_2a_2'$ line, $a_3a_3'$ line and $a_4 a_4'$ line cross the center D of the substrate 102.

Figure 4A:
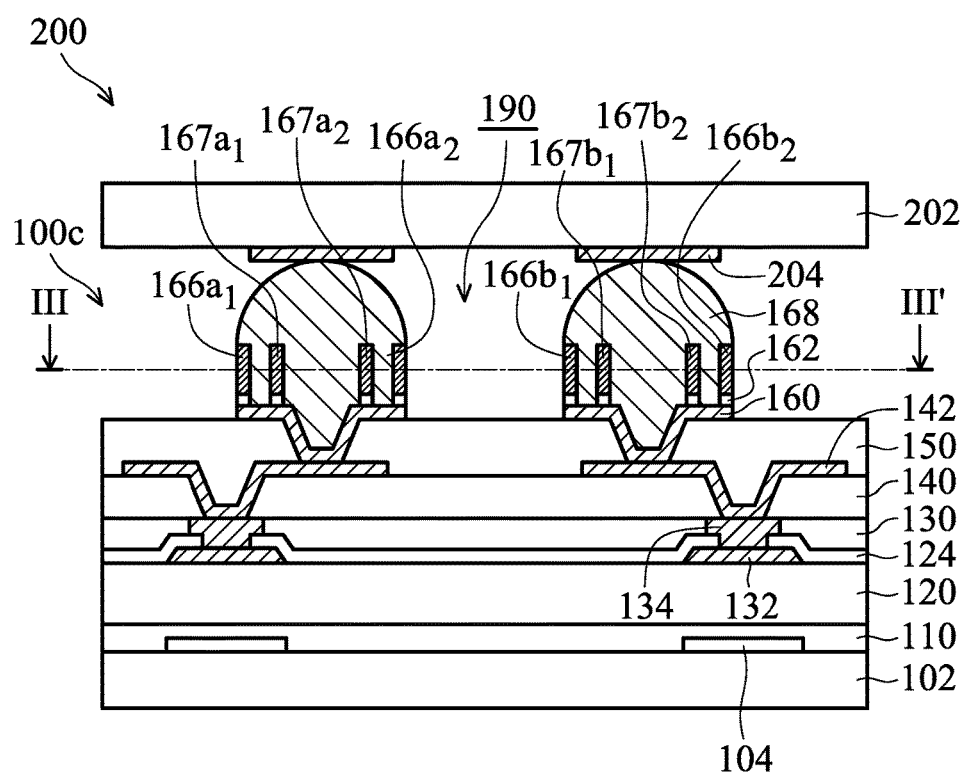
FIG. 4A shows a cross-sectional representation of a package structure, in accordance with some embodiments of the disclosure.
Figure 4B:
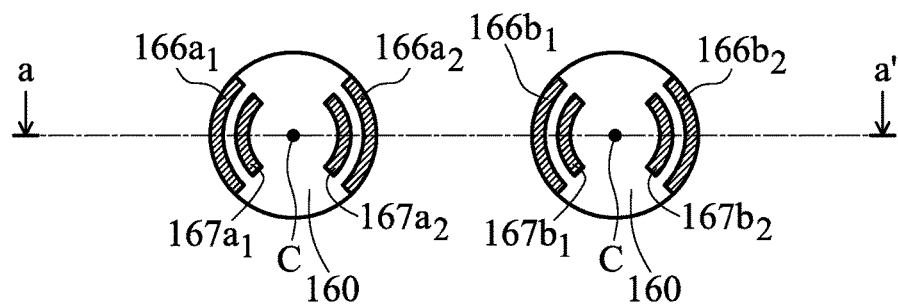
FIG. 4B shows a top view of the first protrusion structure, the second protrusion structure and the UBM layer taken long II-II' line of FIG. 4A, in accordance with some embodiments of the disclosure.
Figure 4C:
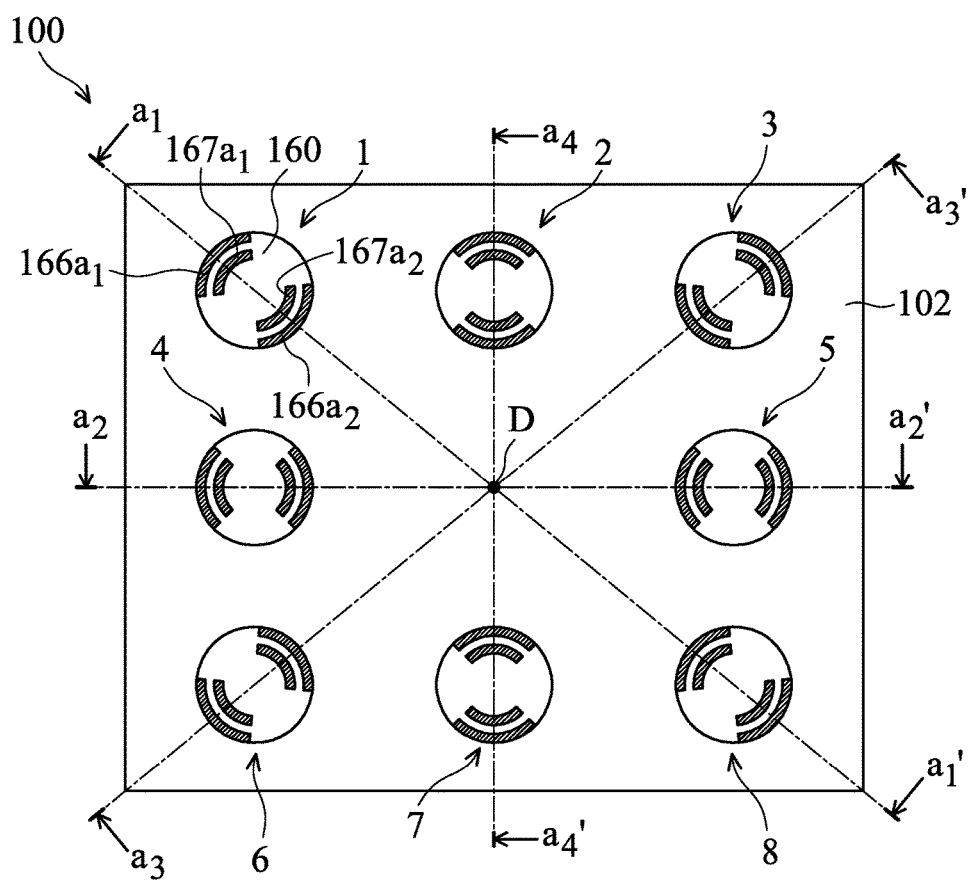
FIG. 4C shows a top view of the arrangement of the first protrusion structure, the second protrusion structure, the UBM layer and the first substrate of FIG. 4A, in accordance with some embodiments of the disclosure.

FIG. 4A shows a cross-sectional representation of a package structure 100c, in accordance with some embodiments of the disclosure. FIG. 4B shows a top view of the first protrusion structure 166a, the second protrusion structure 166b and the UBM layer 160 taken long II-II' line of FIG. 4A, in accordance with some embodiments of the disclosure. FIG. 4C shows a top view of the arrangement of the first protrusion structure 166a, the second protrusion structure 166b, the UBM layer 160 and the first substrate 102 of FIG. 4A, in accordance with some embodiments of the disclosure.

As shown in FIGS. 4A and 4B, the first protrusion structure 166a includes a first non-continuous concentric ring and a second non-continuous concentric ring. The first non-continuous ring includes the first portion $166a_1$ and the second portion $166a_2$, and the second non-continuous ring includes the first portion $167a_1$ and the second portion $167a_2$. The second non-continuous ring is closer to the center C of the UBM layer 160 than the first non-continuous ring. The outer sidewall surface of the first portion $166a_1$ of the first non-continuous ring is aligned to the outer sidewall surface of the UBM layer 160, but the outer sidewall surface of the first portion $167a_1$ of the second non-continuous ring is not aligned to the outer sidewall surface of the UBM layer 160. The crack in the electrical connector 168 can adequately suppressed by the two non-continuous rings.

As shown in FIG. 4C, the aa' line shown in FIG. 4B may be the $a_1a_1'$ line, $a_2a_2'$ line, $a_3a_3'$ line or $a_4 a_4'$ line shown in FIG. 4C. In some embodiments, the substrate 102 is a substrate of a die. There are multiple electrical connectors 168 are formed over the substrate 102. The $a_1a_1'$ line, $a_2a_2'$ line, $a_3a_3'$ line and $a_4 a_4'$ line cross the center D of the substrate 102.

Figure 5A:
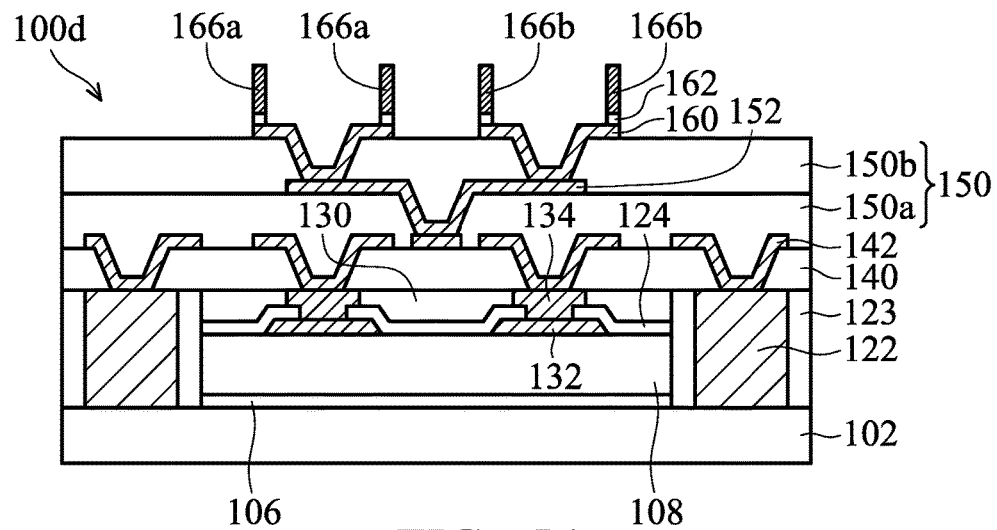
FIGS. 5A-5C show cross-sectional representations of various stages of forming a first package structure, in accordance with some embodiments of the disclosure.
Figure 5B:
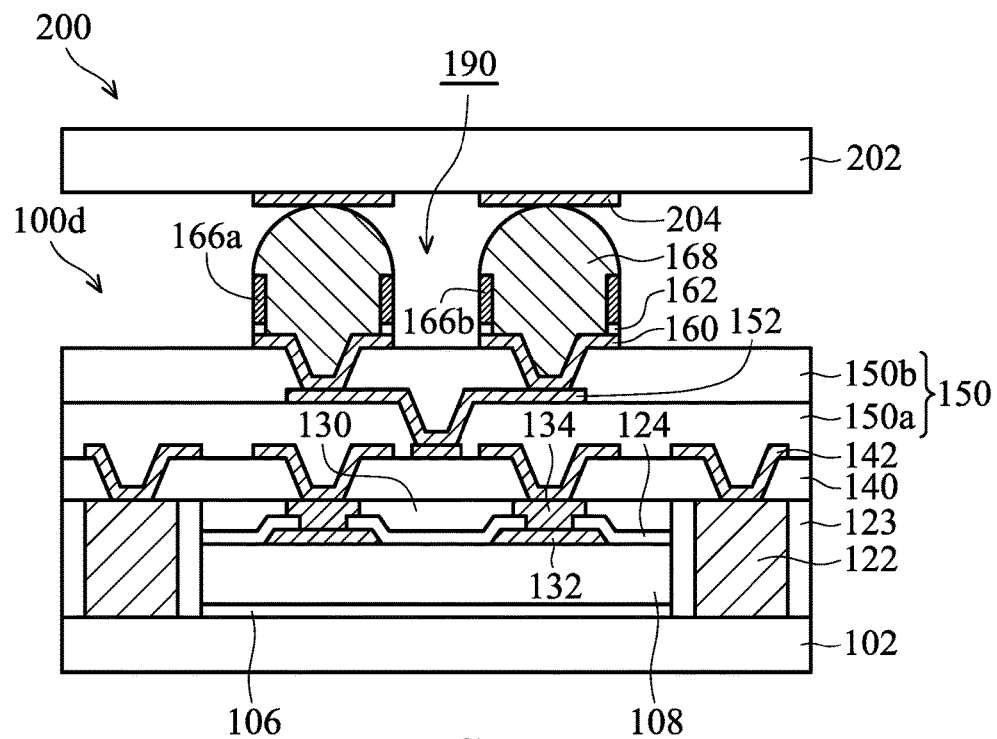
Figure 5C:
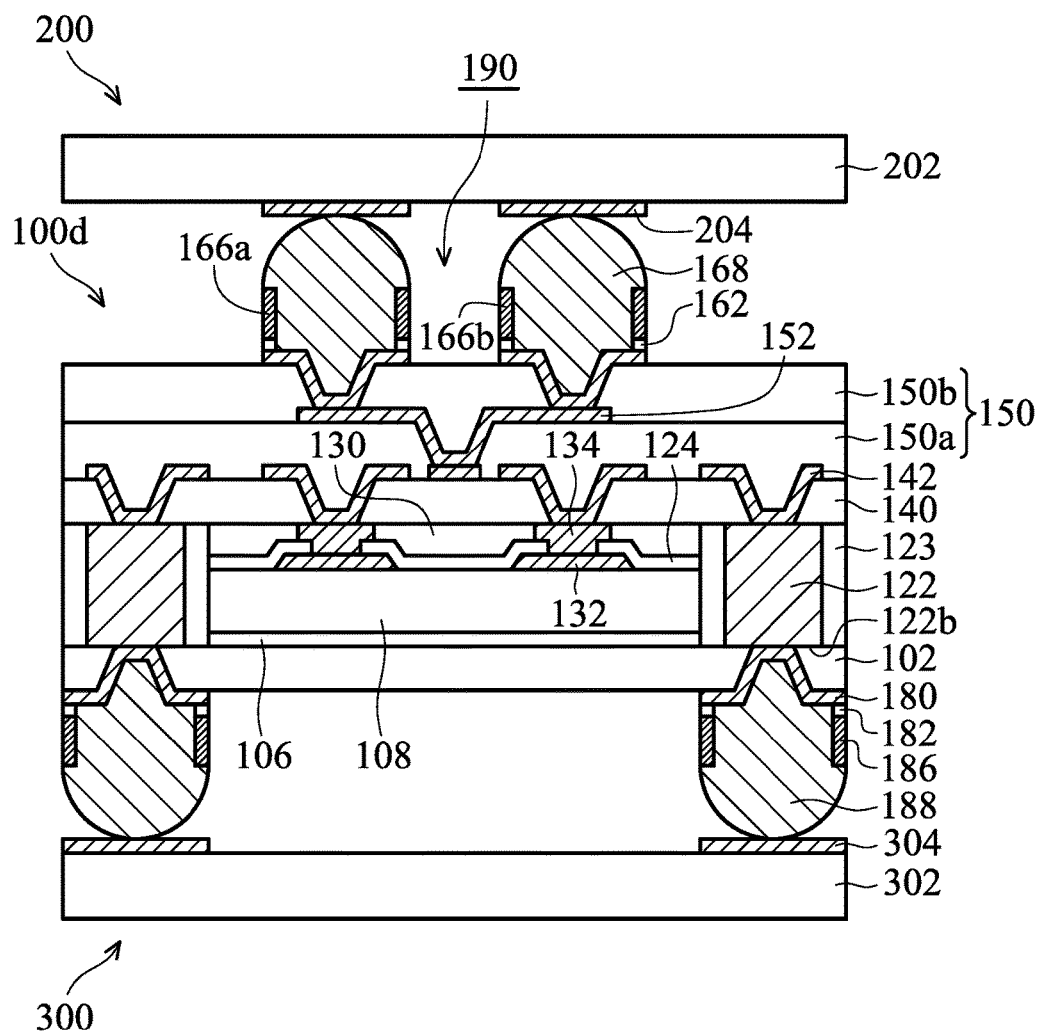

FIGS. 5A-5C show cross-sectional representations of various stages of forming a first package structure 100d, in accordance with some embodiments of the disclosure.

As shown in FIG. 5A, an adhesion layer 106 is formed on the substrate 102, and a device die 108 is formed over the adhesion layer 106. The through via structures 122 are formed adjacent to the device die 108. The insulating layer 123 surrounds the sidewalls of the through via structures 122 and separates the through via structures 122 to the device die 108. In some embodiments, the insulating layer 123 includes silicon oxide, silicon nitride, an oxide of the through via structure 122, a molding compound or a combination thereof.

The through via structures 122 are used to connect to another package structure. The through via structures 122 are made of copper (Cu), gold (Au), silver (Ag), or other applicable materials.

The protection layer 150 includes a first sub-layer 150a and a second sub-layer 150b for allowing more than one level of the conductive layer to be formed in the protection layer 150. In some embodiments, the first sub-layer 150a and the second sub-layer 150b are made of different materials.

A conductive layer 152 is formed in the protection layer 150 and is electrically connected to the conductive layer 142. A UBM layer 160 is formed over the conductive layer 152. The seed layer 162 is formed over the UBM layer 160, and the protrusion structure 166 is formed over the seed layer 162.

Afterwards, as shown in FIG. 5B, the electrical connector 168 is formed over the protrusion structure 166, in accordance with some embodiments of the disclosure. The second package structure 200 is formed over the first package structure 100d. The second package structure 200 includes the conductive pad 204 formed on the second substrate 202. Some device elements (not shown) are formed in the second substrate 202. The first package structure 100d and the second package structure 200 are bonded together by the conductive structure 168 and the conductive pad 204. An air gap 190 is formed between the first protrusion structure 166a and the second protrusion structure 166b. There is no underfill between the first protrusion structure 166a and the second protrusion structure 166b.

Next, as shown in FIG. 5C, a trench (not shown) is formed in the substrate 102, and then a UBM layer 180 is formed in the trench, in accordance with some embodiments of the disclosure. The through via structures 122 have a first surface 122a and a second surface 122b opposite to the first surface 122a. The first surface 122a is in direct contact with the conductive layer 142, and the second surface 122b is in direct contact with the UBM layer 180. A seed layer 182 is formed over the UBM layer 180, and the protrusion structure 186 is formed over the seed layer 182. An electrical connector 188 is formed over the UBM layer 180 and the protrusion structure 186.

A third package structure 300 is formed over the first package structure 100d. The third package structure 300 includes the conductive pad 304 formed on the third substrate 202. The first package structure 100d and the third package structure 300 are bonded together by the conductive structure 188 and the conductive pad 304. The second package structure 200 and the third package structure 300 are on two opposite sides of the substrate 102.

FIGS. 6A-6H show cross-sectional representations of various stages of forming a first package structure 100e, in accordance with some embodiments of the disclosure.

Figure 6A:
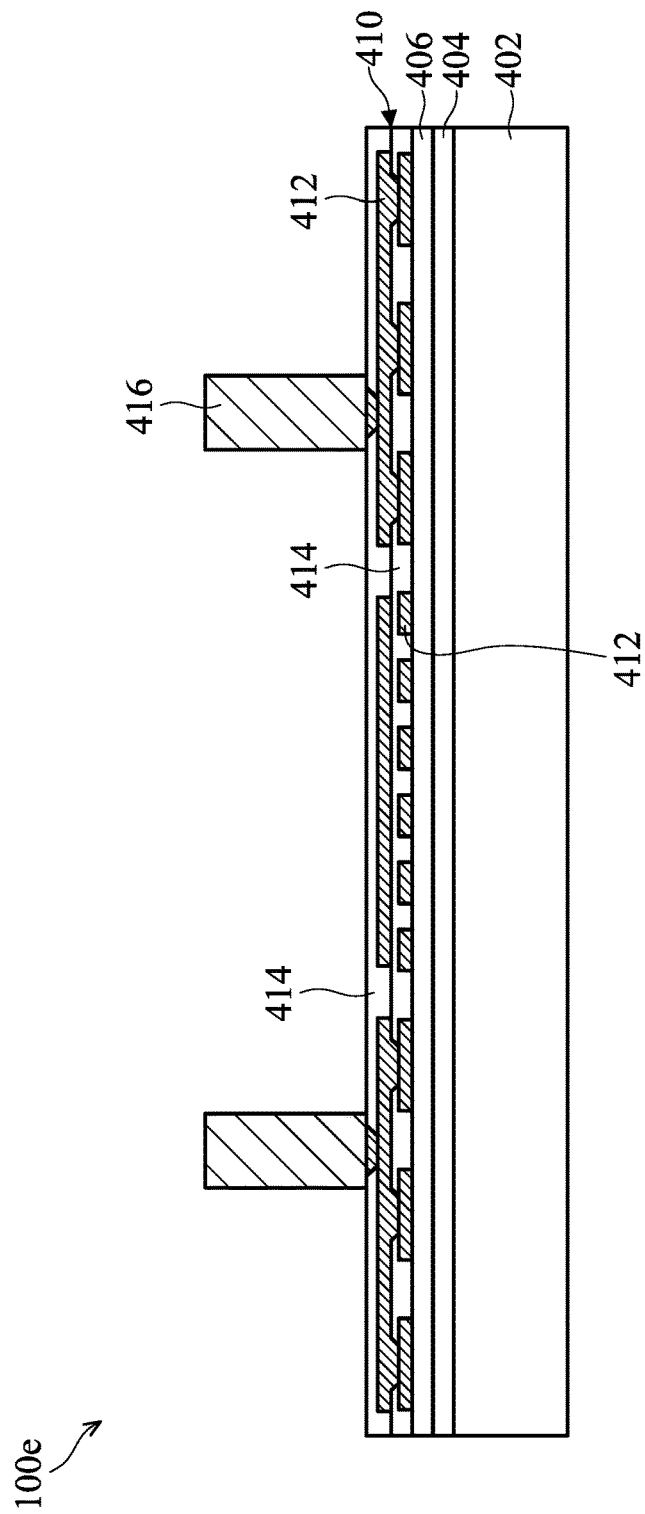

As shown in FIG. 6A, an adhesion layer 404 is formed over a carrier substrate 402. In some embodiments, the carrier substrate 402 is used as a temporary substrate. The temporary substrate provides mechanical and structural support during subsequent processing steps, such as those described in more detail later. The carrier substrate 402 is made of a semiconductor material, ceramic material, polymer material, metal material, another suitable material, or a combination thereof. In some embodiments, the carrier substrate 402 is a semiconductor substrate, such as a silicon wafer.

The adhesive layer 404 is deposited over the carrier substrate 102. The adhesive layer 404 may be made of glue, or may be a lamination material, such as a foil. In some embodiments, the adhesive layer 404 is photosensitive and is easily detached from the carrier substrate 402 by light irradiation. For example, shining ultra-violet (UV) light or laser light on the carrier substrate 102 may detach the adhesive layer 404. In some other embodiments, the adhesive layer 404 is heat-sensitive and is easily detached from the carrier substrate 402 when it is exposed to heat.

Subsequently, a base layer 406 is deposited or laminated over the adhesive layer 404. The base layer 406 provides structural support for bonding an integrated circuit die, which will be described in more detail later, and helps reduce die shifting issues. In some embodiments, the base layer 406 is a polymer layer or a polymer-containing layer. The base layer 406 is a poly-p-phenylenebenzobisthiazole (PBO) layer, a polyimide (PI) layer, a solder resist (SR) layer, an Ajinomoto buildup film (ABF), a die attach film (DAF), another suitable layer, or a combination thereof.

An interconnect structure 410 is formed over the base layer 406. The interconnect structure 410 includes one or more conductive layers in one or more passivation layers. For example, the interconnect structure 410 includes conductive layers 412 formed in the passivation layers 414.

Afterwards, a number of through via structures 416 are formed over the interconnect structure 410, in accordance with some embodiments. In some embodiments, the through via structures 416 are conductive pillars or other suitable structures. The through via structures 416 may be referred to as through interposer vias (TIVs). The through via structures 416 are physically and electrically connected to one of the conductive layers in the interconnect structure 410.

In some embodiments, the through via structures 416 are made of materials that may include copper (Cu), aluminum (Al), nickel (Ni), platinum (Pt), lead-free solder (e.g., SnAg, SnCu, SnAgCu), another suitable conductive material, or a combination thereof. In some embodiments, the through via structures 416 are formed using an electroplating process, a physical vapor deposition (PVD) process, a CVD process, an electrochemical deposition (ECD) process, a molecular beam epitaxy (MBE) process, an atomic layer deposition (ALD) process, or another applicable process.

Figure 6B:
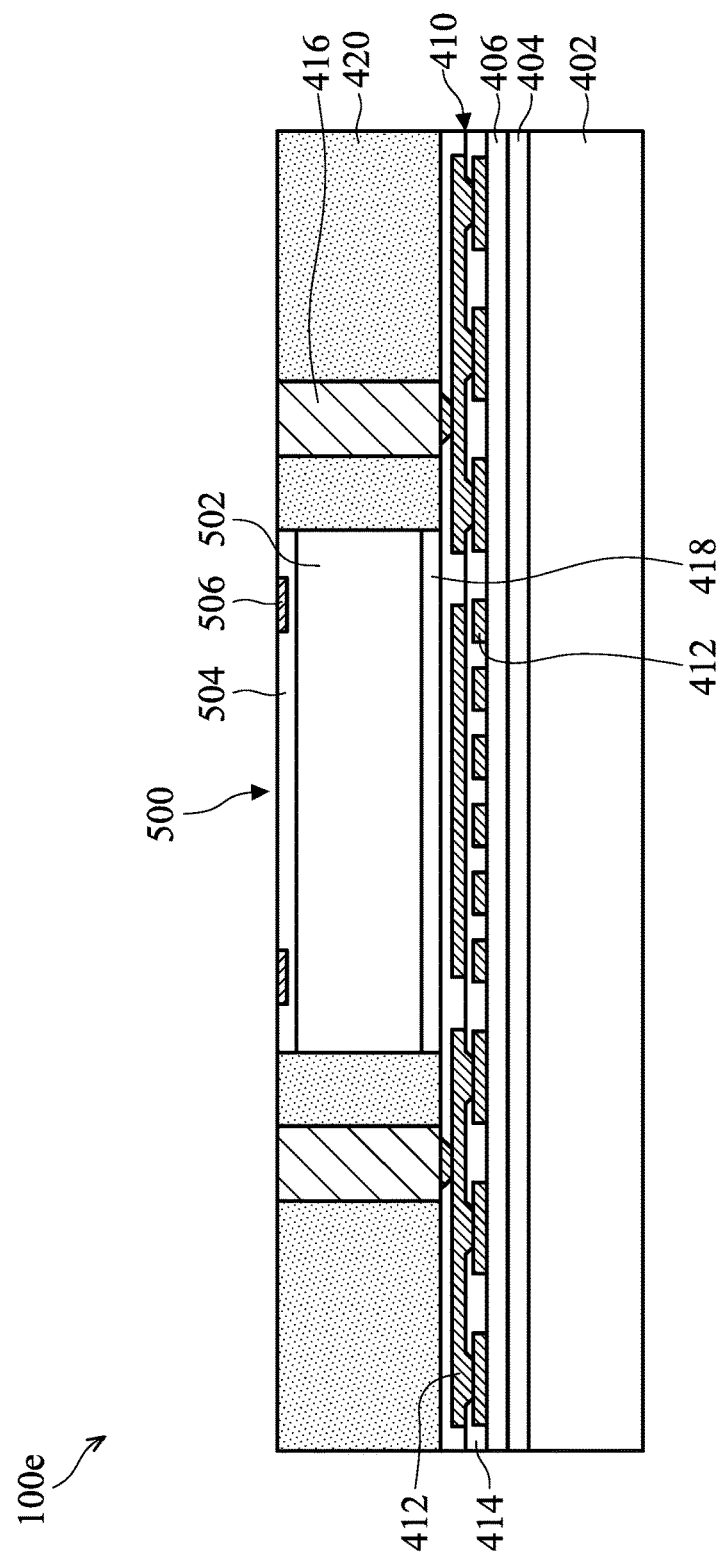

Next, as shown in FIG. 6B, a device die 500 is disposed on the interconnect structure 410 by an adhesion layer 418, in accordance with some embodiments. In some embodiments, the front side (the active surface) of the device die 500 faces away from the interconnect structure 410. The back side (the non-active surface) of the die 200 faces the interconnect structure 410. The device die 500 may be a device die including transistors, diodes, or another suitable integrated circuit element. The device die may also include capacitors, inductors, resistors, another integrated circuit element, or a combination thereof.

In some embodiments, the device die 500 includes a semiconductor substrate 502, a passivation layer 504, and conductive pads 506. The device die 500 may also include connectors on the conductive pads 506, and a protection layer surrounding the connectors. A variety of device elements may be formed in or over the semiconductor substrate 502.

The adhesive layer 418 is used to bond or attach the device die 500 to the interconnect structure 410. The adhesive film 418 includes a DAF, another suitable layer, or a combination thereof.

Afterwards, a package layer 420 is deposited over the interconnect structure 410. As a result, the through via structures 416 and the device die 500 are encapsulated by the package layer 420. In some embodiments, the package layer 420 includes a polymer material. In some embodiments, the package layer 420 includes a molding compound.

In some embodiments, the molding compound is dispensed over the through via structures 416, the device die 500 and the interconnect structure 410 and a thermal process is performed to harden the molding compound. After the planarizing process, the top surface of the device die 500 is substantially level with that of the through via 416 structures. In some embodiments, the planarizing process includes a grinding process, a chemical mechanical polishing (CMP) process, an etching process, another applicable process, or a combination thereof.

Figure 6C:
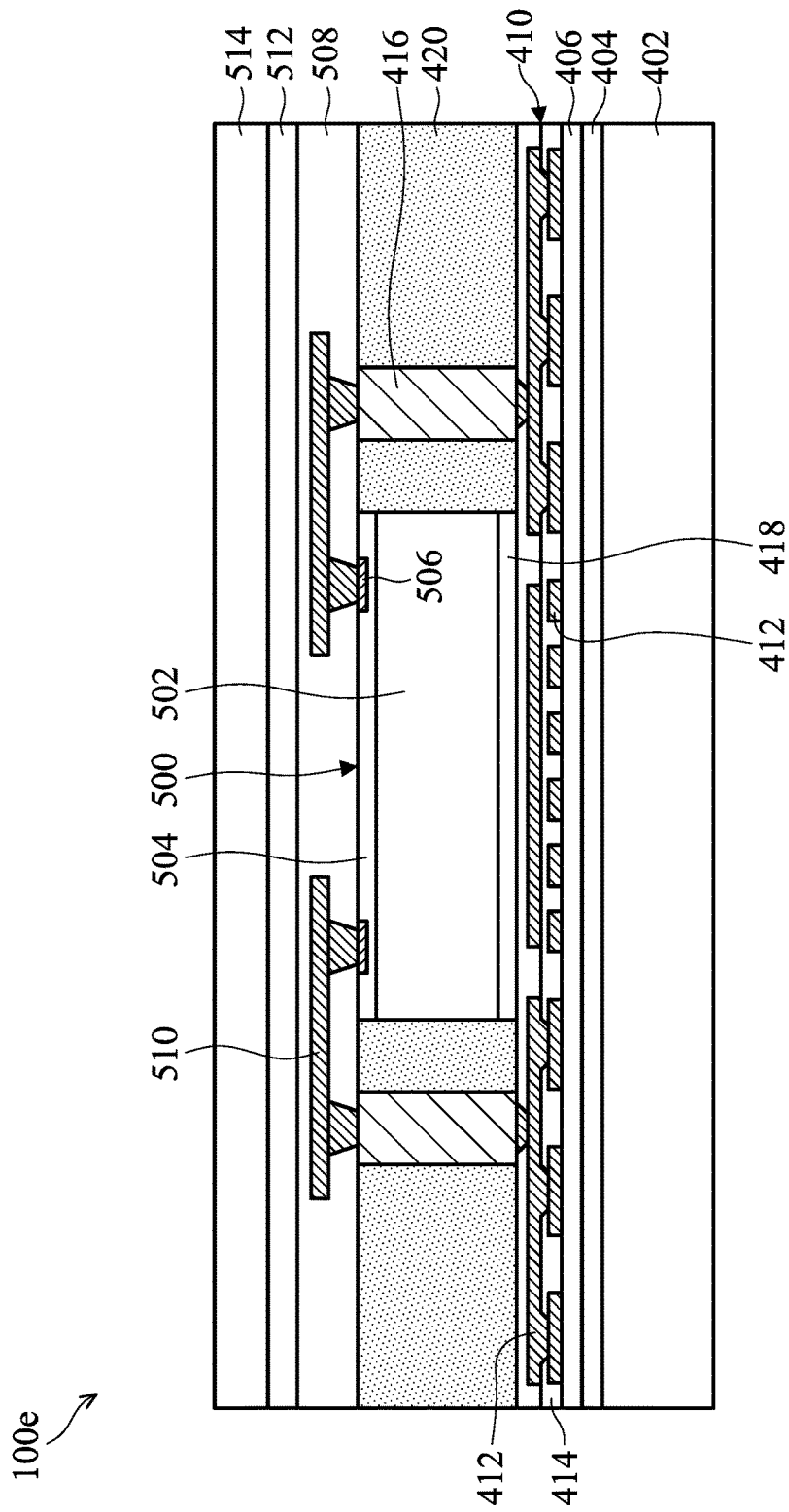

Afterwards, as shown in FIG. 6C, a passivation layer 508 is formed over the package layer 420 and a conductive layer 510 formed in the passivation layer 508, in accordance with some embodiments. A protection layer 512 is formed over the passivation layer 508, and a protection substrate 514 is formed over the protection layer 512.

In some embodiments, the protection substrate 514 is used as a panel of a fingerprint recognition device. The protection substrate 514 is made of a non-organic material or another suitable material. In some embodiments, the protection substrate 514 is a glass substrate, sapphire substrate, or another suitable substrate.

Figure 6D:
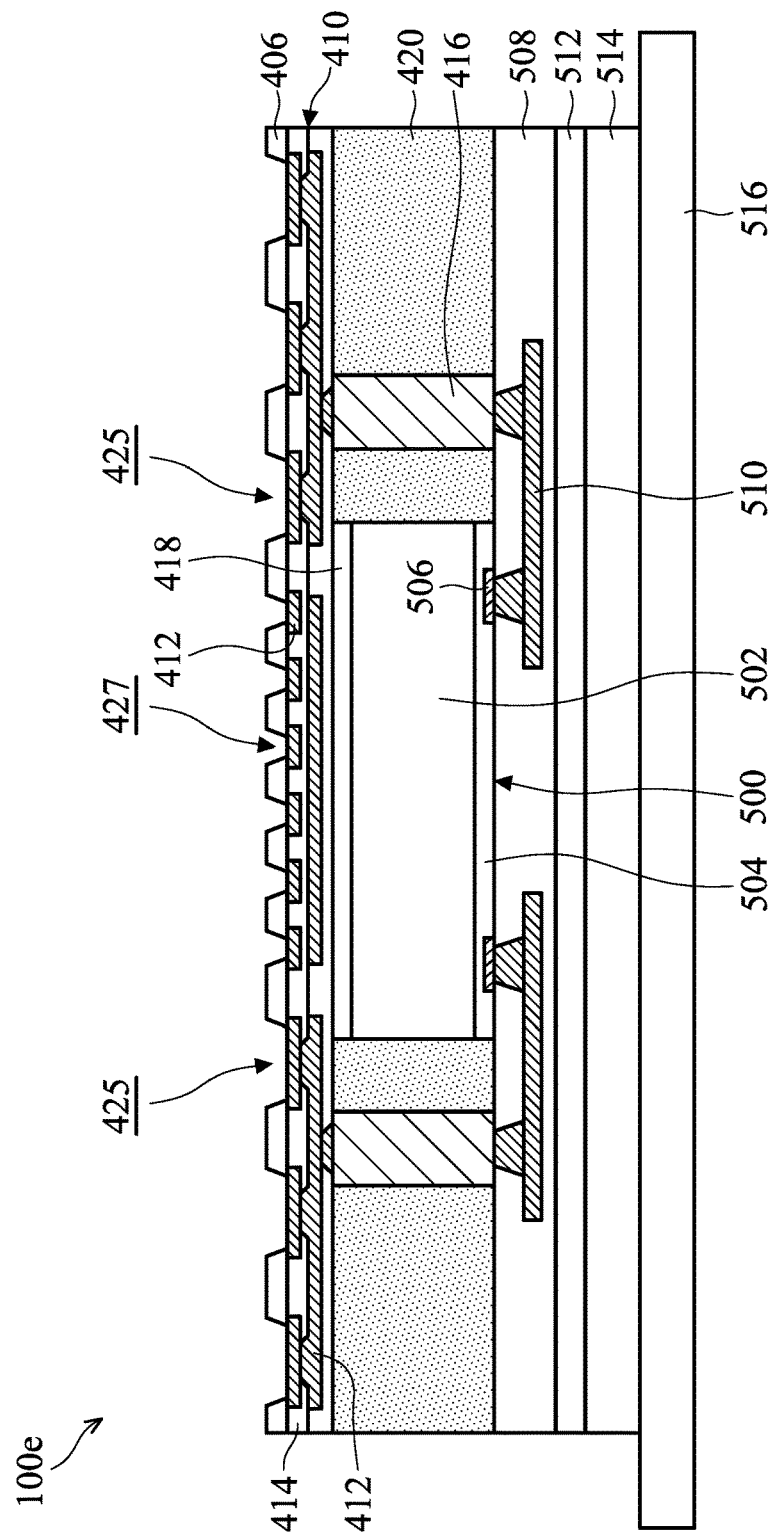

Afterwards, as shown in FIG. 6D, the structure as shown in FIG. 6C is flipped and attached to a carrier 516, in accordance with some embodiments. The carrier 516 includes a tape which is photosensitive or heat-sensitive and is easily detached from the protection substrate 514.

The carrier substrate 402 is removed. In some embodiments, both the carrier substrate 402 and the adhesive layer 404 are removed. Suitable light may be provided to remove the adhesive layer 404 so as to remove the carrier substrate 402 as well.

Subsequently, multiple portions of the base layer 406 are removed to form a number of trenches 425 and a number of openings 427. Portions of the interconnect structure 410, such as portions of the conductive layer 412 are expose by the trenches 425 and openings 427. The trenches 425 are formed over the through via structures 416. The openings 427 are formed over the device die 500. The size of the trenches 425 is greater than that of the openings 427. For example, the width of each of the trenches 425 is greater than the width of each of the openings 427.

Next, as shown in FIG. 6E, a UBM layer 430 is formed in the trenches 425 and a UBM layer 440 is formed in the openings 427, in accordance with some embodiments. A seed layer 432 is formed over the UBM layer 430, and a protrusion structure 436 is formed over the seed layer 432.

Figure 6F:
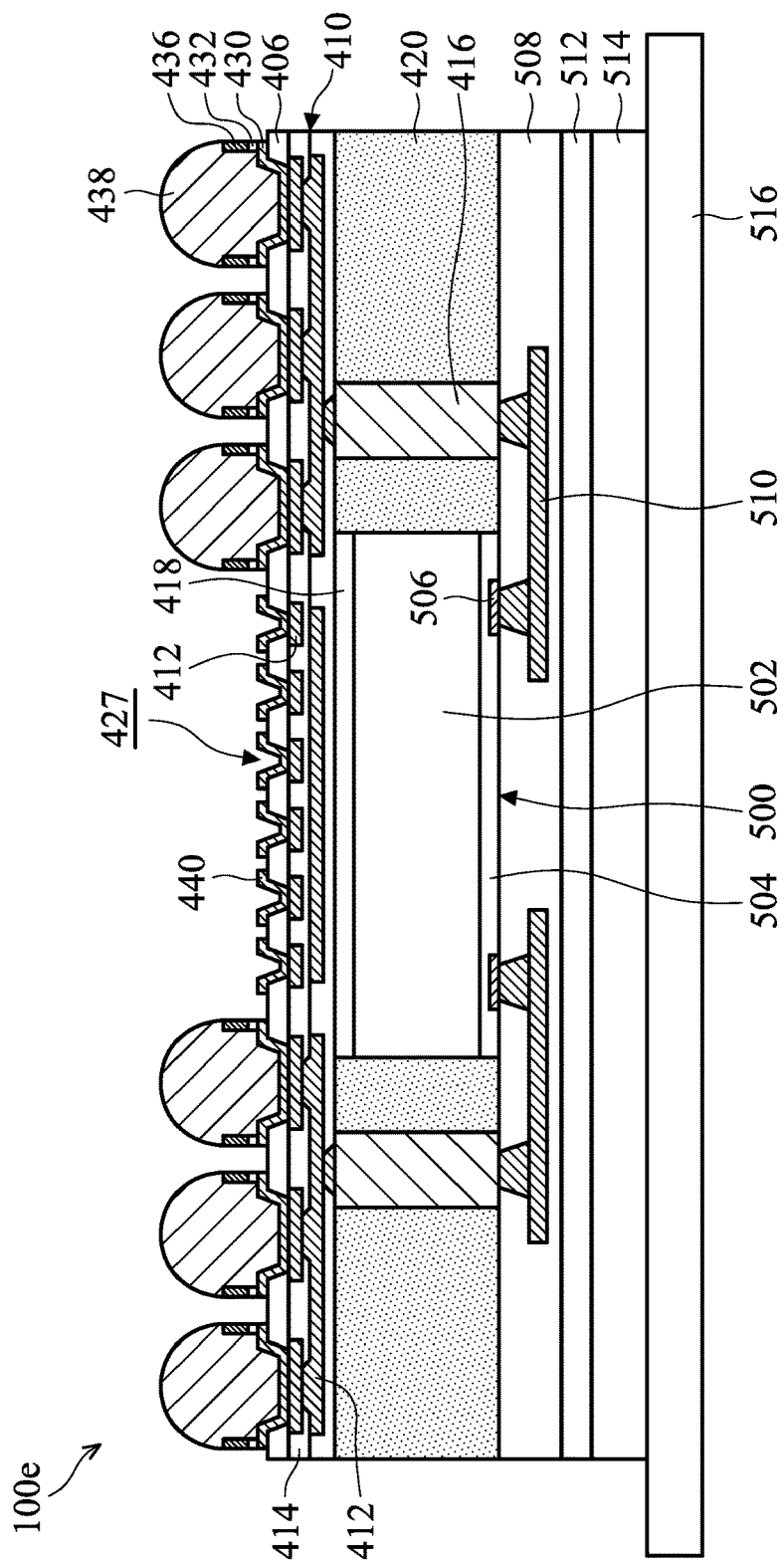

Afterwards, as shown in FIG. 6F, an electrical connector 438 is formed over the UBM layer 430 and the protrusion structure 436, in accordance with some embodiments. The electrical connector 438 is electrically connected to the conductive layer 412 by the UBM layer 430.

Figure 6G:
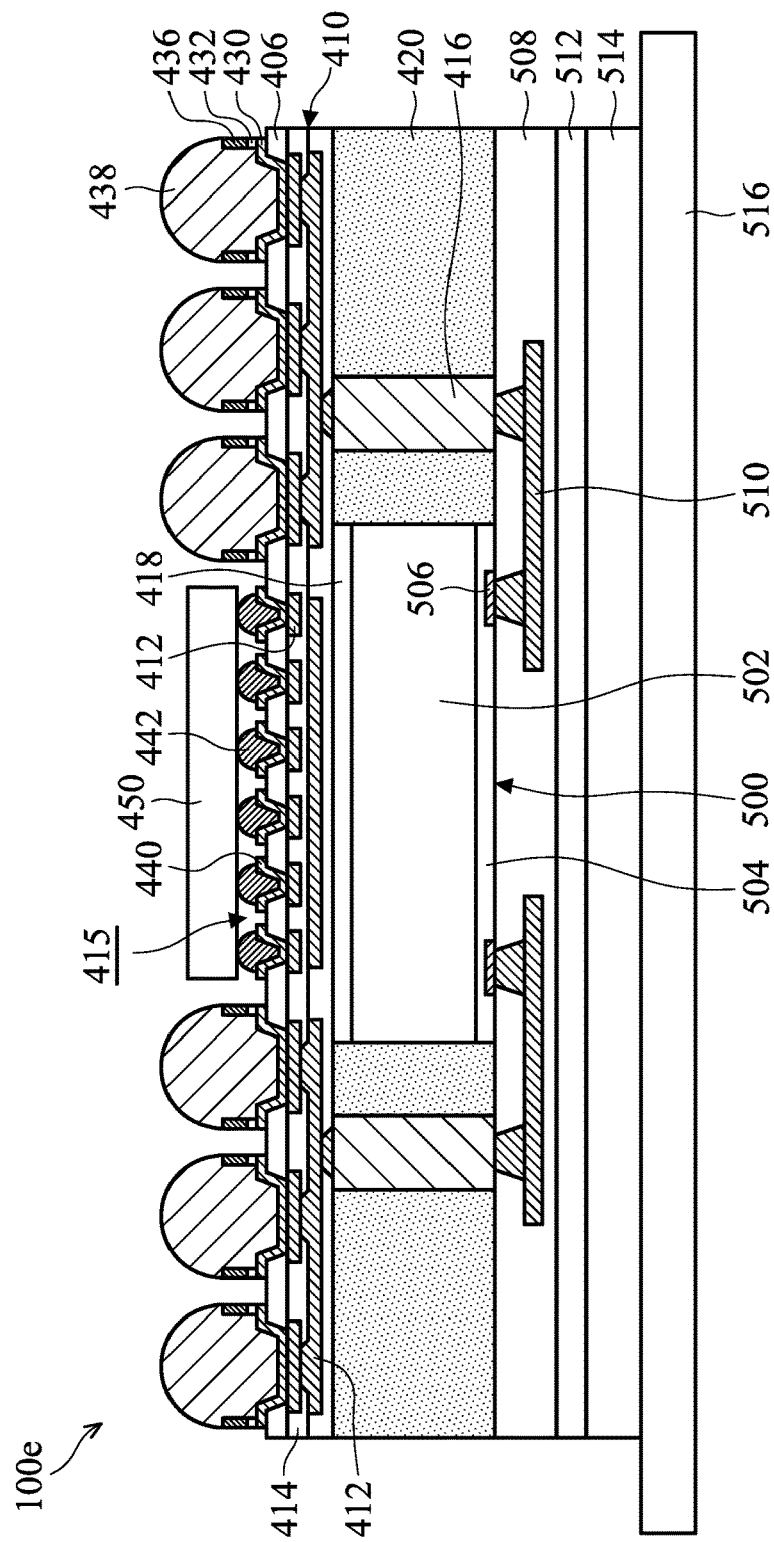

Next, as shown in FIG. 6G, an element 450 is stacked over the interconnect structure 410, in accordance with some embodiments. The element 450 and the device die 500 are on two opposite sides of the base layer 406. The size of the element 450 is smaller than the size of the device die 500. More specifically, the width of the element 450 is smaller than the width of the device die 500. The UBM layer 440 is formed in the openings 427, and a number of electrical connectors 442 are formed over the UBM layer 440. The element 450 is formed over the electrical connectors 442. There is a space 415 between two adjacent electrical connectors 442. The size of each of the electrical connectors 438 is greater than the size of each of the electrical connectors 442. More specifically, the height of the electrical connectors 438 is greater than the height of the electrical connectors 442.

In some embodiments, the element 450 is a device die. For example, the device die is a high-voltage die or another suitable die. In some other embodiments, the element 450 includes a package structure that contains one or more integrated circuit dies.

Figure 6H:
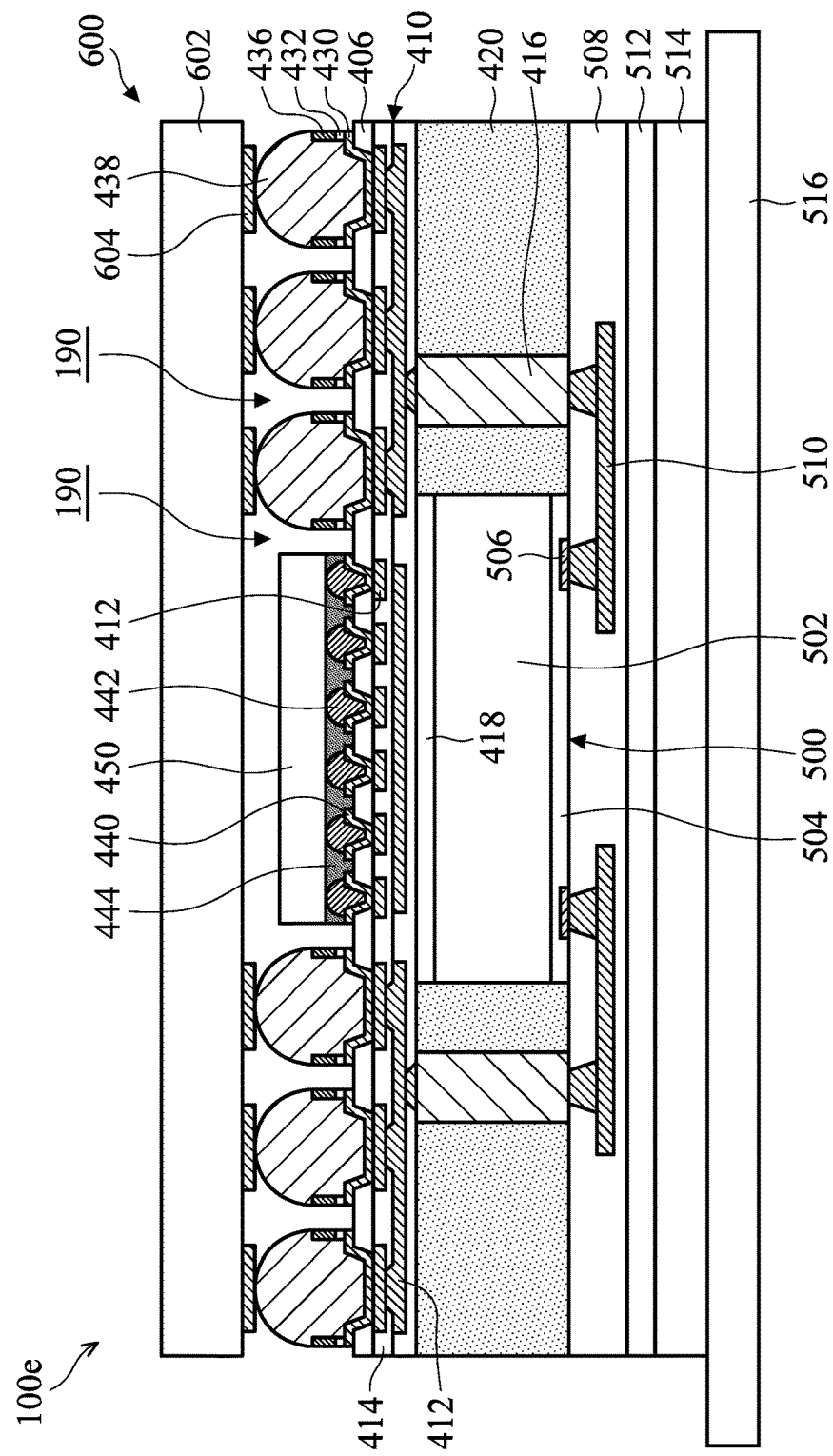

Next, as shown in FIG. 6H, a second package structure 600 is formed over the first package structure 100e, in accordance with some embodiments of the disclosure. The second package structure 600 includes a conductive pad 604 formed on a second substrate 602. Some device elements (not shown) are formed in the second substrate 602. The first package structure 100e and the second package structure 200 are bonded together by the conductive structure 438 and the conductive pad 604. In some embodiments, the carrier 516 is removed to expose the protection substrate 514.

The space 415 is filled with an underfill 444 shown in FIG. 6G. Therefore, the underfill 444 is between two adjacent electrical connectors 442. It should be noted that there is no underfill between two adjacent electrical connectors 436. There is an air gap 190 between the underfill 444 and the electrical connectors 438.

It should be noted that there is more stress concentrated on the electrical connector when the size of the die becomes greater. Therefore, the stress concentrated on the electrical connectors 438 is greater than the stress concentrated on the electrical connectors 442. The high stress may cause cracks to form in the electrical connector. In order to reduce or prevent formation of the cracks, the protrusion structures 436 are embedded in the electrical connectors 438. In some embodiments, the outer sidewall surface of each of the protrusion structures 436 is aligned with the outer sidewall surface of the UBM layer 160 and the electrical connectors 438 to adequately suppress the propagation of cracks in the electrical connector 168.

Embodiments for forming a package structure and method for forming the same are provided. A first package structure includes a conductive layer formed over a substrate or a device die, and a UBM layer is formed over the conductive layer. A seed layer is formed over the UBM layer and a number of protrusion structures are formed over the seed layer. A number of electrical connectors are formed over the protrusion structures. The protrusion structures extend upward away from the UBM layer. The protrusion structures include a first protrusion and a second protrusion structure. An air gap is between the first protrusion and the second protrusion structure. There is no underfill between the first protrusion and the second protrusion structure. The protrusion structures are used as crack-stop structures to prevent cracks from forming in the electrical connector. Therefore, the problem of the electrical connector cracking is reduced, and the performance and reliability of the package structure is improved.

In some embodiments, a package structure is provided. The package structure includes a dielectric layer formed over a first substrate and a conductive layer formed in the dielectric layer. The package structure includes an under bump metallurgy (UBM) layer formed over the dielectric layer, and the UBM layer is electrically connected to the conductive layer. The package structure also includes a first protrusion structure formed over the UBM layer, and the first protrusion structure extends upward away from the UBM layer. The package structure further includes a second protrusion structure formed over the UBM layer, and the second protrusion structure extends upward away from the UBM layer. The package structure includes a first conductive connector formed over the first protrusion structure; and a second conductive connector formed over the second protrusion structure. An air gap is formed between the first protrusion structure and the second protrusion structure.

In some embodiments, a package structure is provided. The package structure includes a device die formed over a first substrate and a conductive pad formed over the device die. The package structure includes a dielectric layer formed over the conductive pad and a conductive layer formed in the dielectric layer and over the conductive pad. The conductive pad is electrically connected to the conductive layer. The package structure also includes a first under bump metallurgy (UBM) layer formed over the dielectric layer, and the UBM layer is electrically connected to the conductive layer. The package structure further includes a first protrusion structure formed over the UBM layer and a first electrical connector formed over the first protrusion structure. The package structure includes a through via structure formed adjacent to the device die and a second UBM layer formed below the through via structure. The package structure also includes a second protrusion structure formed over the UBM layer and a second electrical connector formed over the second protrusion structure.

In some embodiments, a package structure is provided. The package structure includes a first device die formed over a first substrate and a package layer surrounding the first device die. The package structure also includes a conductive layer formed over the first device die and the package layer and a plurality of first electrical connectors formed over the first device die. The first electrical connector has a first height. The package structure includes a plurality of second electrical connectors formed over the package layer, and the second electrical connector has a second height that is greater than the first height. The package structure also includes a second device die formed over the first electrical connectors and a plurality of protrusion structures embedded in the second electrical connectors. The protrusion structures extend upward away from the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a dielectric layer formed over a first substrate;
   a conductive layer formed in the dielectric layer;
   an under bump metallurgy (UBM) layer formed over the dielectric layer, wherein the UBM layer is electrically connected to the conductive layer;
   a first protrusion structure formed over the UBM layer, wherein the first protrusion structure extends upward away from the UBM layer;
   a second protrusion structure formed over the UBM layer, wherein the second protrusion structure extends upward away from the UBM layer;
   a first conductive connector formed over the first protrusion structure; and
   a second conductive connector formed over the second protrusion structure, wherein an air gap is formed between the first protrusion structure and the second protrusion structure.

2. The package structure as claimed in claim 1, wherein the first protrusion structure has an outer sidewall surface, and the outer sidewall surface is aligned with an outer surface of the UBM layer.

3. The package structure as claimed in claim 1, wherein the first protrusion structure has a non-continuous shape when seen from a top view, the non-continuous shape comprises a first portion and a second portion, and the first portion and the second portion are symmetric to a center of the UBM layer.

4. The package structure as claimed in claim 1, wherein the first protrusion structure has a non-continuous concentric ring shape when seen from a top view, and the non-continuous shape comprises a first non-continuous ring and a second non-continuous ring.

5. The package structure as claimed in claim 1, wherein a melting point of the first protrusion structure is higher than a melting point of the first conductive connector.

6. The package structure as claimed in claim 1, further comprising:
   a second substrate formed over the first conductive connector and the second conductive connector, wherein the first conductive connector is electrically connected to a conductive pad of the second substrate.

7. The package structure as claimed in claim 6, further comprising:
   a device die formed over the first substrate;
   a through via structure formed adjacent to the device die; and
   a third substrate formed below the through via, wherein the through via structure is electrically connected to a conductive pad of the third substrate.

8. The package structure as claimed in claim 1, wherein no underfill is between the first conductive connector and the second conductive connector.

9. A package structure, comprising:
   a device die formed over a first substrate;
   a conductive pad formed over the device die;
   a dielectric layer formed over the conductive pad;
   a conductive layer formed in the dielectric layer and over the conductive pad, wherein the conductive pad is electrically connected to the conductive layer;

a first under bump metallurgy (UBM) layer formed over the dielectric layer, wherein the UBM layer is electrically connected to the conductive layer;
a first protrusion structure formed over the UBM layer;
a first electrical connector formed over the first protrusion structure;
a through via structure formed adjacent to the device die;
a second UBM layer formed below the through via structure;
a second protrusion structure formed over the UBM layer; and
a second electrical connector formed over the second protrusion structure.

10. The package structure as claimed in claim 9, wherein the first protrusion structure and the second protrusion structure both have a non-continuous shape when seen from a top view, the non-continuous shape comprises a first portion and a second portion, and the first portion and the second portion are symmetric to the center of the UBM layer.

11. The package structure as claimed in claim 9, wherein each of the first protrusion structure and the second protrusion structure has a non-continuous concentric ring shape when seen from a top view, the non-continuous concentric ring shape comprises a first non-continuous ring and a second non-continuous ring.

12. The package structure as claimed in claim 9, wherein the first protrusion structure and the second protrusion structure both are located at the diagonal lines of the first substrate when seen from a top view.

13. The package structure as claimed in claim 9, wherein a melting point of the first protrusion structure is higher than a melting point of the first conductive connector.

14. The package structure as claimed in claim 9, further comprising:
a second substrate formed over the first conductive connector; and
a third substrate formed below the second conductive connector.

15. The package structure as claimed in claim 14, further comprising:
a second substrate formed over the second electrical connectors, wherein the second conductive connectors are electrically connected to a conductive pad of the second substrate.

16. A package structure, comprising:
a first device die formed over a first substrate;
a package layer surrounding the first device die;
a conductive layer formed over the first device die and the package layer;
a plurality of first electrical connectors formed over the first device die, wherein the first electrical connector has a first height;
a plurality of second electrical connectors formed over the package layer, wherein the second electrical connector has a second height that is greater than the first height;
a second device die formed over the first electrical connectors; and
a plurality of protrusion structures embedded in the second electrical connectors, wherein the protrusion structures extend upward away from the conductive layer.

17. The package structure as claimed in claim 16, further comprising:
a first under bump metallurgy (UBM) layer formed below the second electrical connectors, wherein each of the first protrusion structures has an outer sidewall surface, and the outer sidewall surface is aligned with an outer surface of UBM layer.

18. The package structure as claimed in claim 17, further comprising:
a through via structure formed adjacent to the first device die, wherein the through via structure is electrically connected to the conductive layer.

19. The package structure as claimed in claim 17, further comprising:
an underfill formed between two adjacent first electrical connectors.

20. The package structure as claimed in claim 19, further comprising:
an air gap between the underfill and the protrusion structures.

* * * * *